(12) United States Patent
Lee

(10) Patent No.: US 12,052,864 B2
(45) Date of Patent: Jul. 30, 2024

(54) SEMICONDUCTOR MEMORY DEVICE AND METHOD OF MANUFACTURING THE SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix inc., Icheon-si (KR)

(*) Notice: Subject to any disclaimer, the term of this patent is extended or adjusted under 35 U.S.C. 154(b) by 268 days.

(21) Appl. No.: 16/950,549

(22) Filed: Nov. 17, 2020

(65) Prior Publication Data

US 2021/0408034 A1    Dec. 30, 2021

(30) Foreign Application Priority Data

Jun. 25, 2020  (KR) .......................... 10-2020-0077985

(51) Int. Cl.
| | | |
|---|---|---|
| *H10B 43/27* | (2023.01) | |
| *H01L 23/522* | (2006.01) | |
| *H10B 41/27* | (2023.01) | |
| *H10B 41/40* | (2023.01) | |
| *H10B 43/40* | (2023.01) | |

(52) U.S. Cl.
CPC ......... *H10B 43/27* (2023.02); *H01L 23/5226* (2013.01); *H10B 41/27* (2023.02); *H10B 41/40* (2023.02); *H10B 43/40* (2023.02)

(58) Field of Classification Search
CPC ........... H01L 27/11582; H01L 27/1157; H01L 29/66545; H01L 27/11556; H01L 27/11573; H10B 41/27; H10B 41/40; H10B 43/27; H10B 43/40
See application file for complete search history.

(56) References Cited

U.S. PATENT DOCUMENTS

| | | | |
|---|---|---|---|
| 10,361,218 B2 | 7/2019 | Arai | |
| 10,490,565 B1* | 11/2019 | Arisumi | ........... H01L 27/11565 |
| 2018/0323213 A1* | 11/2018 | Arai | ....................... H10B 43/50 |
| 2019/0043888 A1* | 2/2019 | Lee | ................... H01L 27/11565 |
| 2019/0305096 A1* | 10/2019 | Choi | ................. H01L 29/41741 |

FOREIGN PATENT DOCUMENTS

KR    1020190132834 A    11/2019

* cited by examiner

*Primary Examiner* — Tony Tran
(74) *Attorney, Agent, or Firm* — WILLIAM PARK & ASSOCIATES LTD.

(57) ABSTRACT

A semiconductor memory device, and a method of manufacturing the semiconductor memory device, includes a gate stacked body, an insulating layer overlapping the gate stacked body, a first source layer including a horizontal portion between the gate stacked body and the insulating layer and a protrusion extending from the horizontal portion so as to penetrate the insulating layer, a channel layer penetrating the gate stacked body and extending into the horizontal portion of the first source layer, a first memory pattern between the channel layer and the gate stacked body, and a second source layer disposed between the gate stacked body and the first source layer and coming in contact with the channel layer.

20 Claims, 24 Drawing Sheets

SEMICONDUCTOR MEMORY DEVICE AND METHOD OF MANUFACTURING THE SEMICONDUCTOR MEMORY DEVICE

CROSS-REFERENCE TO RELATED APPLICATION

The present application claims priority under 35 U.S.C. § 119(a) to Korean patent application number 10-2020-0077985, filed on Jun. 25, 2020, in the Korean Intellectual Property Office, the entire disclosure of which is incorporated herein by reference.

BACKGROUND

1. Technical Field

Various embodiments of the present disclosure relate to a semiconductor memory device and a method of manufacturing the semiconductor memory device, and more particularly, to a three-dimensional (3D) semiconductor memory device and a method of manufacturing the 3D semiconductor memory device.

2. Related Art

A semiconductor memory device includes memory cells which can store data. A three-dimensional (3D) semiconductor memory device includes memory cells arranged in three dimensions, thus reducing a two-dimensional (2D) area occupied by memory cells on a substrate.

In order to improve the degree of integration in a 3D semiconductor memory device, the number of stacked memory cells may be increased.

SUMMARY

A semiconductor memory device according to an embodiment of the present disclosure may include a gate stacked body, an insulating layer overlapping the gate stacked body, a first source layer including a horizontal portion between the gate stacked body and the insulating layer and a protrusion extending from the horizontal portion so as to penetrate the insulating layer, a channel layer penetrating the gate stacked body and extending into the horizontal portion of the first source layer, a first memory pattern between the channel layer and the gate stacked body, and a second source layer disposed between the gate stacked body and the first source layer and coming in contact with the channel layer.

Another semiconductor memory device according to an embodiment of the present disclosure may include a first gate stacked body surrounding a first channel structure, a second gate stacked body adjacent to the first gate stacked body and surrounding a second channel structure, a vertical insulating structure between the first gate stacked body and the second gate stacked body, and a first source layer. The first source layer includes a protrusion overlapping the vertical insulating structure and having a groove facing the vertical insulating structure, a first horizontal portion extending from a first side of the protrusion to overlap the first channel structure and the first gate stacked body, and a second horizontal portion extending from a second side of the protrusion to overlap the second channel structure and the second gate stacked body. The semiconductor memory device further includes a second source layer surrounding the first channel structure between the first source layer and the first gate stacked body and surrounding the second channel structure between the first source layer and the second gate stacked body.

A method of manufacturing a semiconductor memory device according to an embodiment of the present disclosure may include forming an insulating layer on a sacrificial substrate, forming a first opening passing through the insulating layer, forming a first source layer coming in contact with the sacrificial substrate through the first opening and extending over the insulating layer, forming a sacrificial source layer on the first source layer, forming a gate stacked body on the sacrificial source layer, the gate stacked body surrounding a channel structure, and replacing the sacrificial source layer with a second source layer coming in contact with the channel structure.

DETAILED DESCRIPTION

Specific structural or functional descriptions disclosed herein are merely illustrative for the purpose of describing embodiments according to the concept of the present disclosure. Embodiments according to the concept of the present disclosure can be implemented in various forms, and should not be construed as being limited to the specific embodiments set forth herein.

Hereinafter, the terms 'first' and 'second' are used to distinguish one component from another component. For example, a first component may be referred to as a second component without departing from a scope in accordance with the concept of the present disclosure and similarly, a second component may be referred to as a first component.

Embodiments of the present disclosure are directed to a semiconductor memory device capable of improving the stability of a manufacturing process and a method of manufacturing the semiconductor memory device.

Figure 1:
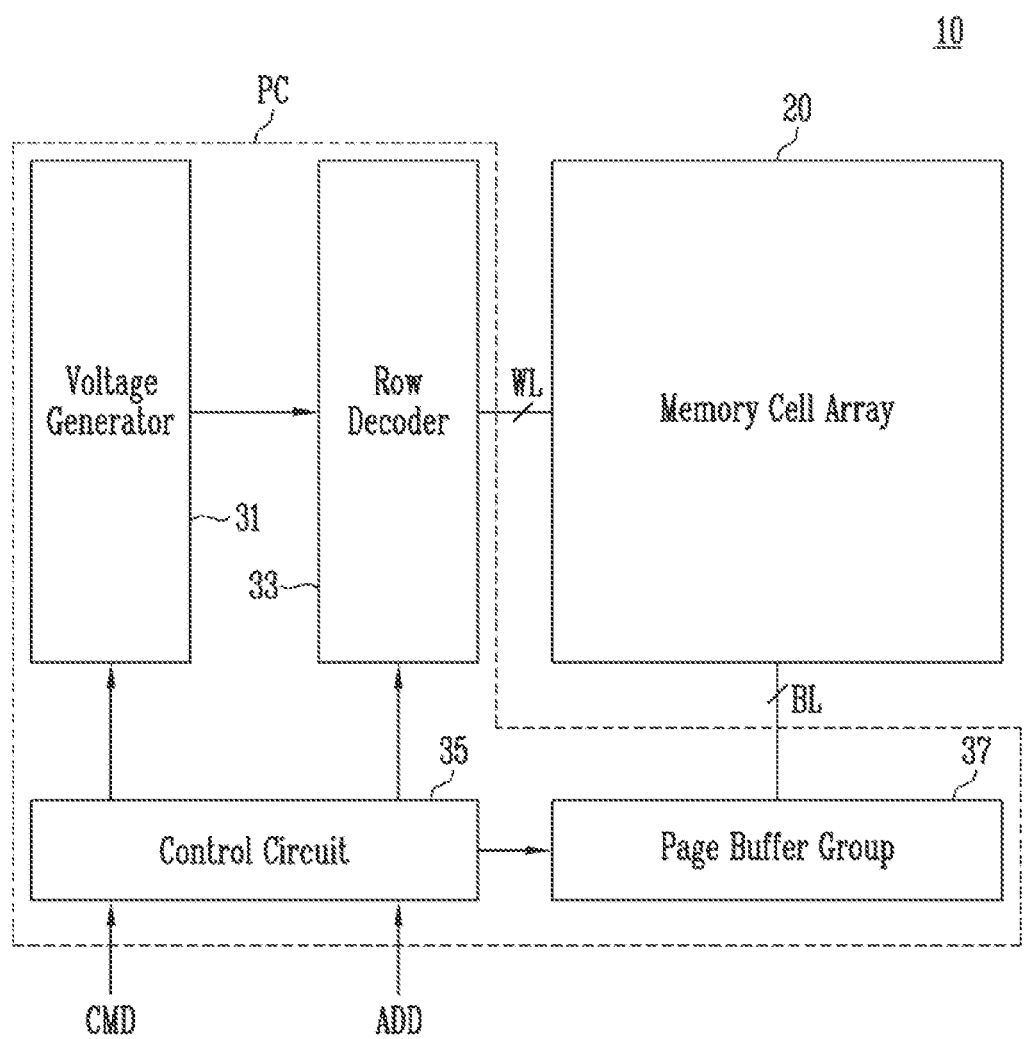
FIG. 1 is a block diagram illustrating a semiconductor memory device according to an embodiment of the present disclosure.

FIG. 1 is a block diagram illustrating a semiconductor memory device 10 according to an embodiment of the present disclosure.

Referring to FIG. 1, the semiconductor memory device 10 may include a peripheral circuit PC and a memory cell array 20.

The peripheral circuit PC may control a program operation of storing data in the memory cell array 20, a read operation of outputting data stored in the memory cell array 20, and an erase operation of erasing data stored in the memory cell array 20.

In an embodiment, the peripheral circuit PC may include a voltage generator 31, a row decoder 33, a control circuit 35, and a page buffer group 37.

The memory cell array 20 may include a plurality of memory blocks. The memory cell array 20 may be coupled to the row decoder 33 through word lines WL, and may be coupled to the page buffer group 37 through bit lines BL.

The control circuit 35 may control the peripheral circuit PC in response to a command CMD and an address ADD.

The voltage generator 31 may generate various operating voltages, such as a pre-erase voltage, an erase voltage, a ground voltage, a program voltage, a verify voltage, a pass voltage, and a read voltage, which are used for a program operation, a read operation, and an erase operation, under the control of the control circuit 35.

The row decoder 33 may select a memory block under the control of the control logic 35. The row decoder 33 may apply the operating voltages to word lines WL coupled to the selected memory block.

The page buffer group 37 may be coupled to the memory cell array 20 through the bit lines BL. The page buffer group 37 may temporarily store data received from an input/output circuit (not illustrated) under the control of the control circuit 35 during a program operation. The page buffer group 37 may sense voltages or currents of the bit lines BL under the control of the control circuit 35 during a read operation or a verify operation. The page buffer group 37 may select the bit lines BL under the control of the control circuit 35.

Each of the memory blocks in the memory cell array 20 may include a plurality of cell strings. Each of the cell strings may include memory cells coupled to the word lines.

Figure 2:
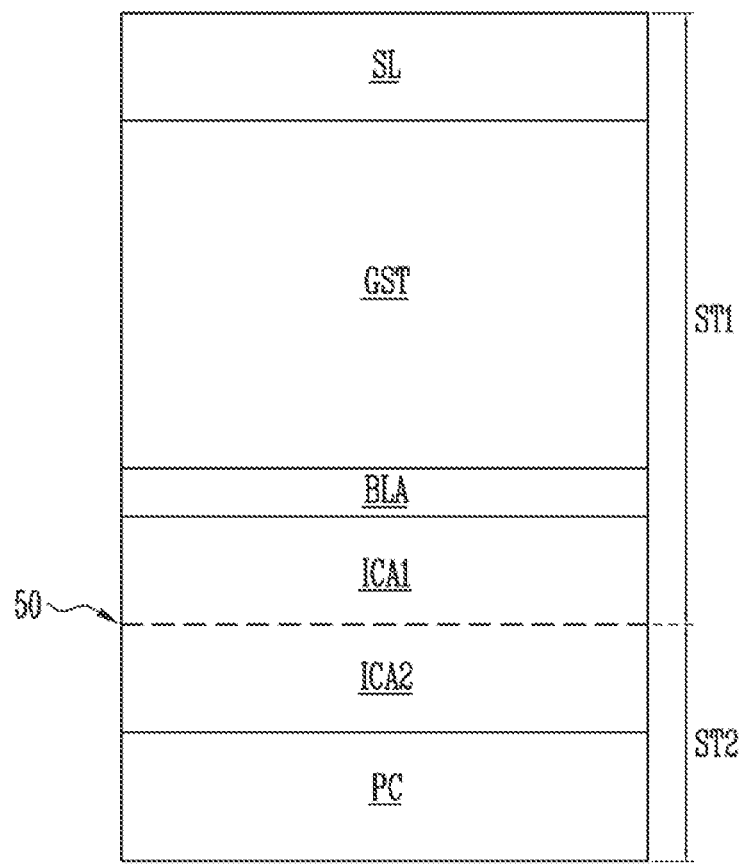
FIG. 2 is a view illustrating the vertical arrangement of a semiconductor memory device according to an embodiment of the present disclosure.

FIG. 2 is a view illustrating the vertical arrangement of a semiconductor memory device according to an embodiment of the present disclosure.

Referring to FIG. 2, the semiconductor memory device may include a first structure ST1 and a second structure ST2 that are bonded to each other. The bonding surface 50 between the first structure ST1 and the second structure ST2 may include bonding surfaces between insulating layers and between metal layers.

The first structure ST1 may include a source structure SL, a bit line array BLA, a gate stacked body GST disposed between the source structure SL and the bit line array BLA, and a first interconnection array ICA1 disposed between the bonding surface 50 and the bit line array BLA. The source structure SL may include source layers formed of different materials. The bit line array BLA may include a plurality of bit lines. The gate stacked body GST may include at least one source select line, at least one drain select line, and word lines that are stacked in a state in which they are spaced apart from each other between the source select line and the drain select line. The first interconnection array ICA1 may include a plurality of conductive pads, a plurality of conductive vias, a plurality of conductive wires, and a plurality of bonding patterns.

The second structure ST2 may include a peripheral circuit PC and a second interconnection array ICA2 disposed between the bonding surface 50 and the peripheral circuit PC. The peripheral circuit PC may include the voltage generator 31, the row decoder 33, the control circuit 35, and the page buffer group 37, which are illustrated in FIG. 1. The second interconnection array ICA2 may include a plurality of conductive pads, a plurality of conductive vias, a plurality of conductive wires, and a plurality of bonding patterns.

The bonding patterns of the first interconnection array ICA1 may be bonded to the bonding patterns of the second interconnection array ICA2. Accordingly, the first interconnection array ICA1 may be electrically coupled to the second interconnection array ICA2. The peripheral circuit PC may be electrically coupled to at least one of the bit line array BLA, the gate stacked body GST, and the source structure SL via the first interconnection array ICA1 and the second interconnection array ICA2.

Figure 3:
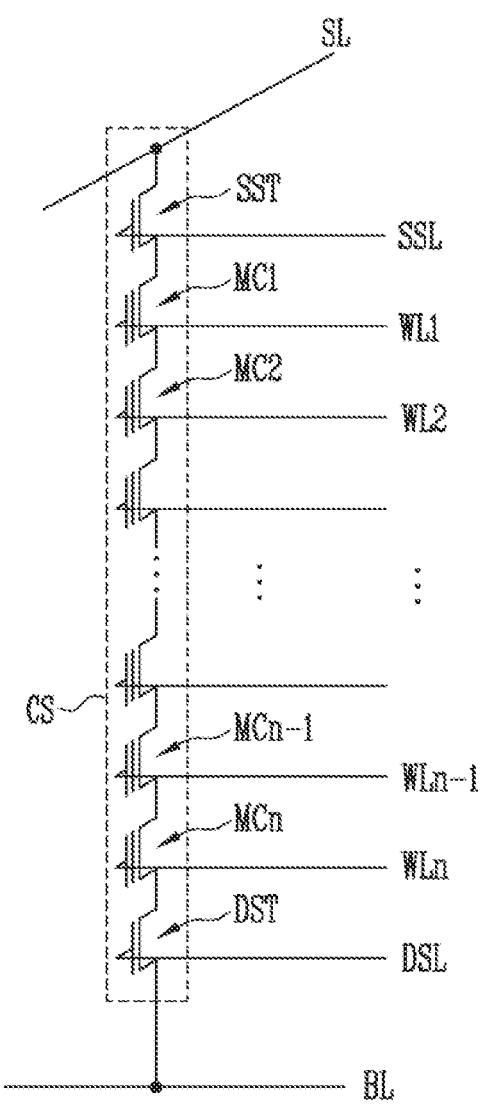
FIG. 3 is a circuit diagram illustrating a cell string according to an embodiment of the present disclosure.

FIG. 3 is a circuit diagram illustrating a cell string CS according to an embodiment of the present disclosure.

Referring to FIG. 3, the cell string CS may be coupled to a source structure SL and a bit line BL. The cell string CS may include a plurality of memory cells MC1 to MCn, at least one source select transistor SST, and at least one drain select transistor DST.

The plurality of memory cells MC1 to MCn may be coupled in series. The gates of the plurality of memory cells MC1 to MCn may be coupled to corresponding word lines of a plurality of word lines WL1 to WLn, which are stacked in a state in which they are spaced apart from each other.

The at least one source select transistor SST may control the electrical coupling between the cell string CS and the source structure SL. According to an embodiment, the cell string CS may include a single source select transistor SST disposed between the source structure SL and the plurality of memory cells MC1 to MCn. The present disclosure is not limited thereto. According to an embodiment, the cell string CS may include two or more source select transistors that are disposed between the source structure SL and the plurality of memory cells MC1 to MCn and coupled to each other in series. The gate of the source select transistor SST may be coupled to a source select line SSL.

The at least one drain select transistor DST may control the electrical coupling between the cell string CS and the bit line BL. According to an embodiment, the cell string CS may include a single drain select transistor DST disposed between the bit line BL and the plurality of memory cells MC1 to MCn. The present disclosure is not limited thereto. According to an embodiment, the cell string CS may include two or more drain select transistors that are disposed between the bit line BL and the plurality of memory cells MC1 to MCn and coupled to each other in series. The gate of the drain select transistor DST may be coupled to a drain select line DSL.

The source select line SSL, the plurality of word lines WL1 to WLn, and the drain select line DSL may be implemented by conductive patterns that are stacked in a state in which they are spaced apart from each other. The source select transistor SST, the plurality of memory cells MC1 to MCn, and the drain select transistor DST may be coupled to each other in series by the channel layer of a channel structure. The source structure SL may be coupled to the channel layer of the channel structure.

Figure 4A:
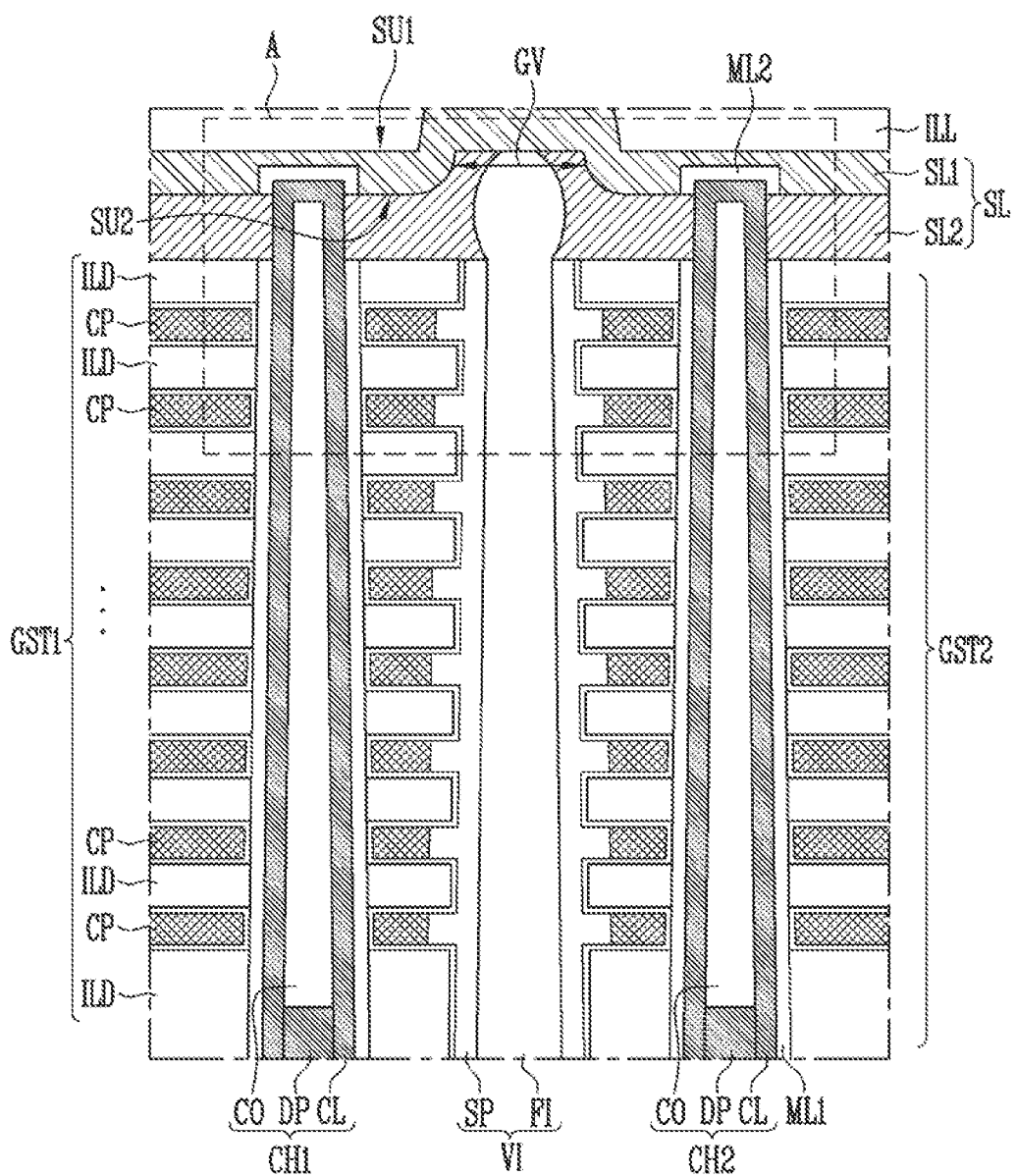
FIG. 4A and FIG. 4B are cross-sectional views illustrating a memory cell array according to an embodiment of the present disclosure.
Figure 4B:
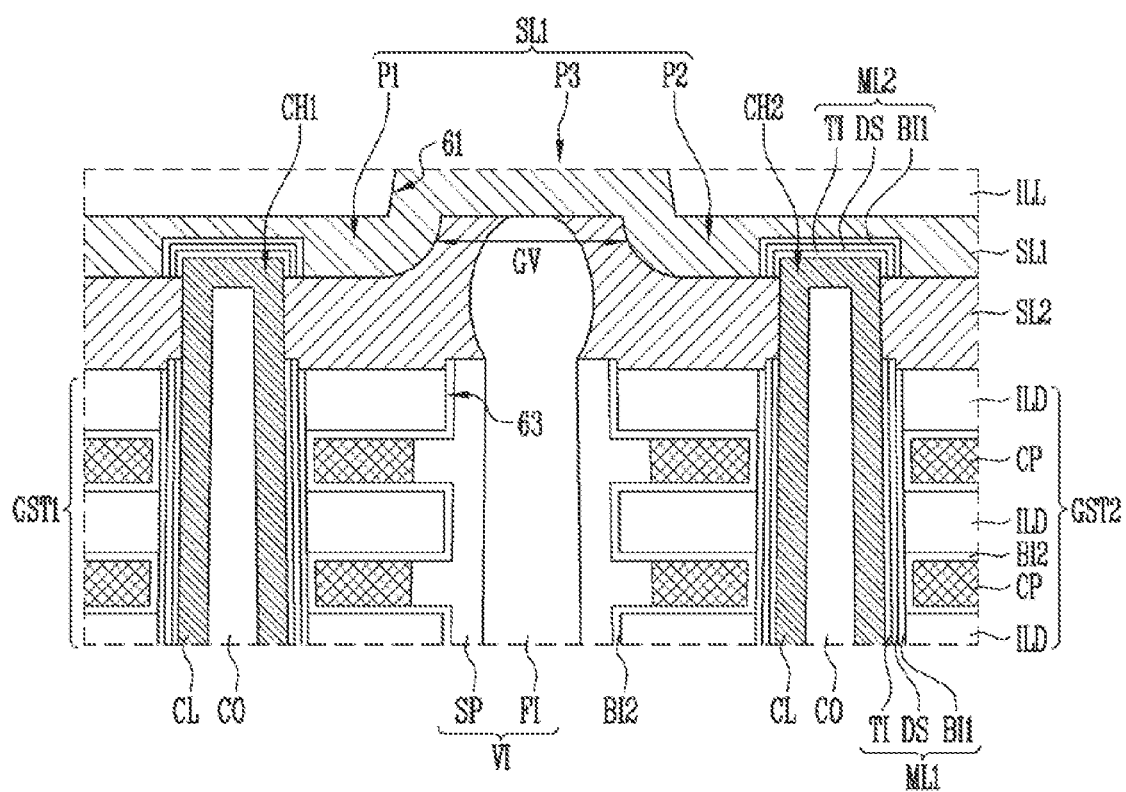

FIG. 4A and FIG. 4B are cross-sectional views illustrating a memory cell array according to an embodiment of the present disclosure. FIG. 4A is a cross-sectional view illustrating the source structure SL of a memory cell array and the first and second gated stacked bodies GST1 and GST2 of the memory cell array, which are adjacent to each other, FIG. 4B is an enlarged cross-sectional view of an area A illustrated in FIG. 4A.

Referring to FIG. 4A and FIG. 4B, each of the first and second gated stacked bodies GST1 and GST2 may include interlayer insulating layers ILD and conductive patterns CP, which are alternately disposed in a direction in which they are stacked. The conductive patterns CP may be used as the source select line SSL, the plurality of word lines WL1 to WLn, and the drain select line DSL, which are illustrated in FIG. 3.

The first gate stacked body GST1 may be penetrated by a first channel structure CH1, and the second gate stacked body GST2 may be penetrated by a second channel structure CH2. The first channel structure CH1 may be surrounded by the interlayer insulating layers ILD and the conductive patterns CP of the first gate stacked body GST1, and the second channel structure CH2 may be surrounded by the interlayer insulating layers ILD and the conductive patterns CP of the second gate stacked body GST2. The first channel structure CH1 and the second channel structure CH2 may extend in the direction in which the interlayer insulating layers ILD and the conductive patterns CP are stacked.

The gap space between the first gate stacked body GST1 and the second gate stacked body GST2 may be filled with a vertical insulating structure VI.

The source structure SL may extend so as to overlap the first gate stacked body GST1, the vertical insulating structure VI, and the second gate stacked body GST2. An insulating layer ILL may extend so as to cover a portion of the source structure SL that overlaps the first gate stacked body GST1 and the second gate stacked body GST2. In other words, a portion of the source structure SL may be disposed between the first gate stacked body GST1 and the insulating layer ILL and between the second gate stacked body GST2 and the insulating layer ILL. A portion of the source structure SL overlapping the vertical insulating structure VI may extend so as to penetrate the insulating layer ILL.

The source structure SL may include a first source layer SL1 and a second source layer SL2. The first source layer SL1 may include a material that is different from the material included in the second source layer SL2.

The first source layer SL1 may overlap the first gate stacked body GST1, the vertical insulating structure VI, and the second gate stacked body GST2, and may penetrate the insulating layer ILL. The first source layer SL1 may include a first surface SU1 in contact with the insulating layer ILL and a second surface SU2 opposite the first surface SU1. A groove GV may be formed on the second surface SU2 of the first source layer SL1.

The second source layer SL2 may be disposed between the first source layer SL1 and each of the first gate stacked body GST1 and the second gate stacked body GST2. The second source layer SL2 may extend so as to surround each of the first channel structure CH1 and the second channel structure CH2. In other words, the first channel structure CH1 and second channel structure CH2 may extend so as to penetrate the second source layer SL2.

Each of the first channel structure CH1 and the second channel structure CH2 may extend into the first source layer SL1. Each of the first channel structure CH1 and the second channel structure CH2 may include a core insulating layer CO, a channel layer CL, and a doped semiconductor pattern DP.

The core insulating layer CO may extend in the direction in which the interlayer insulating layers ILD and the conductive patterns CP are to stacked so as to penetrate the interlayer insulating layers ILD and the conductive patterns CP. The core insulating layer CO may overlap the doped semiconductor pattern DP.

The channel layer CL may surround the sidewall of the core insulating layer CO. The channel layer CL may extend between the core insulating layer CO and the first source layer SL1 so as to close the end portion of the core insulating layer CO facing the first source layer SL1. The channel layer CL may extend so as to surround the sidewall of the doped semiconductor pattern DR The channel layer CL may be in direct contact with the second source layer SL2 protruding towards the sidewall of the channel layer CL.

According to an embodiment, the channel layer CL may include undoped silicon, and the doped semiconductor pattern DP may include n-type doped silicon. According to an embodiment, a portion of the channel layer CL surrounding the doped semiconductor pattern DP may include the same dopant as the dopant of the doped semiconductor pattern DP.

The sidewalls of the first channel structure CH1 and the second channel structure CH2 may be respectively surrounded by first memory patterns MLA. The first memory patterns ML1 may be disposed between the first channel structure CH1 and the first gate stacked body GST1 and between the second channel structure CH2 and the second gate stacked body GST2, respectively.

The end portions of the first channel structure CH1 and the second channel structure CH2 facing the first source layer SL1 may be covered by second memory patterns ML2, respectively. The second memory patterns ML2 may be respectively disposed between the first source layer SL1 and the first channel structure CH1 and between the first source layer SL1 and the second channel structure CH2. The second memory patterns ML2 may be spaced apart from the first memory patterns ML2 by the second source layer SL2.

A vertical insulating structure VI may be disposed between the first gate stacked body GST1 and the second gate stacked body GST2, and may extend in the direction in which the interlayer insulating layers ILD and the conductive patterns CP are stacked. The vertical insulating structure VI may include a spacer insulating layer SP and a gap-fill insulating layer FI. The spacer insulating layer SP may extend so as to cover the sidewall of each of the first gate stacked body GST1 and the second gate stacked body GST2.

Referring to FIG. 4B, the first source layer SL1 may include a first horizontal portion P1, a second horizontal portion P2, and a protrusion P3. The first horizontal portion P1 may extend so as to overlap the first channel structure CH1 and the first gate stacked body GST1. The protrusion P3 may extend from the first horizontal portion P1, and may overlap the vertical insulating structure VI. The protrusion P3 may have a curved shape so as to have a groove GV facing the vertical insulating structure VI. The protrusion P3 may extend so as to penetrate the insulating layer ILL. The second horizontal portion P2 may extend from the protrusion P3, and may extend so as to overlap the second channel structure CH2 and the second gate stacked body GST2. According to an embodiment of the present disclosure, the first horizontal portion P1 may extend from a first side of the protrusion P3 and the second horizontal portion P2 may extend from a second side of the protrusion P3.

The first source layer SL1 may have a lower resistivity than the second source layer SL2. The first source layer SL1 may include a conductive material, the electrical characteristics of which are not changed or slightly changed at a high temperature caused during the process of manufacturing the semiconductor memory device. According to an embodiment, the first source layer SL1 may include at least one of a tungsten silicide layer and a cobalt silicide layer. The second source layer SL2 may include a doped semiconductor layer. According to an embodiment, the second source layer SL2 may include n-type doped silicon.

The sidewalls 63 of the interlayer insulating layers ILD may protrude towards the gap-fill insulating layer FI with respect to the surface 61 between the protrusion P3 of the first source layer SL1 and the insulating layer ILL. In an embodiment, the interlayer insulating layers ILD may extend so as to be overlapped by a portion of the protrusion P3 of the first source layer SL1.

The gap-fill insulating layer FI of the vertical insulating structure VI may extend into the second source layer SL2 overlapping the groove GV. According to an embodiment, the gap-fill insulating layer FI may penetrate the second source layer SL2 so as to be in contact with the first source layer SL1. An embodiment of the present disclosure is not limited thereto. Although not illustrated in the drawing, the surface of the gap-fill insulating layer FI facing the first source layer SL1 may be spaced apart from the first source layer SL1 and covered by the second source layer SL2, according to an embodiment.

The channel layer CL of the first channel structure CH1 may extend into the first horizontal portion P1 of the first source layer SL1, and the channel layer CL of the second channel structure CH2 may extend into the second horizontal portion P2 of the first source layer SL1.

Each of the first memory pattern ML1 and the second memory pattern ML2 may include a tunnel insulating layer TI, a data storage layer DS, and a first blocking insulating layer BI1.

The tunnel insulating layer TI may extend along the surface of the channel layer CL. The tunnel insulating layer TI may include an insulating material enabling charge tunneling. According to an embodiment, the tunnel insulating layer TI may include a silicon oxide layer.

The data storage layer DS may extend along the surface of the tunnel insulating layer TI. The data storage layer DS may include a material layer capable of storing data. According to an embodiment, the data storage layer DS may include a nitride layer capable of storing changed data using Fowler-Nordheim tunneling.

The first blocking insulating layer BI1 may extend along the surface of the data storage layer DS. The first blocking insulating layer BI1 may include an oxide layer.

The conductive patterns CP may surround the first memory pattern MLA between the interlayer insulating layers ILD adjacent to each other in the direction in which the interlayer insulating layers ILD and the conductive patterns CP are stacked. A second blocking insulating layer BI2 may be formed between each of the conductive patterns CP and the first blocking insulating layer BI1. The second blocking insulating layer BI2 may include an insulating material having a higher dielectric constant than the first blocking insulating layer BI1. According to an embodiment, the second blocking insulating layer BI2 may include a metal oxide. According to an embodiment, the metal oxide may include an aluminum oxide layer. The second blocking insulating layer BI2 may extend between the conductive patterns CP and the interlayer insulating layers ILD, The second blocking insulating layer BI2 may extend between the spacer insulating layer SP and the interlayer insulating layers ILD.

Figure 5:
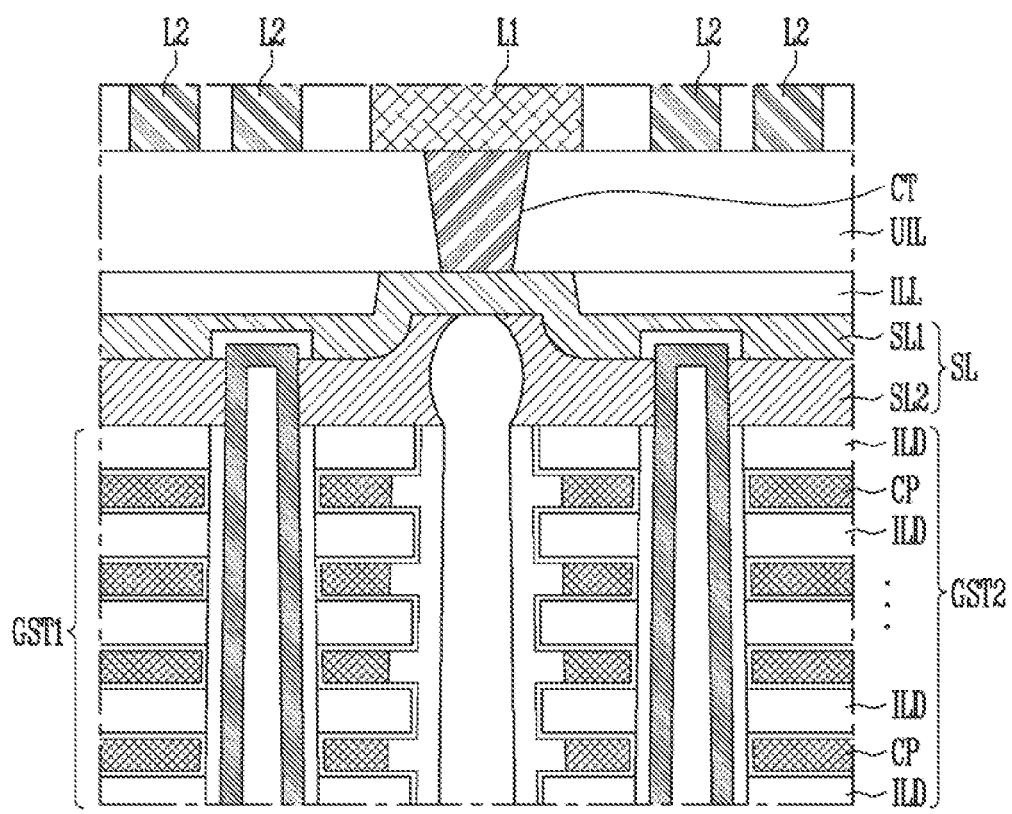
FIG. 5 is a cross-sectional view illustrating upper wires according to an embodiment of the present disclosure.

FIG. 5 is a cross-sectional view illustrating upper wires L1 and L2 according to an embodiment of the present disclosure.

Referring to FIG. 5, the upper wires L1 and L2 may overlap the source structure SL, The insulating layer ILL and an upper insulating layer UIL may be interposed between the upper wire L1 and L2 and the source structure SL.

The upper insulating layer UIL may extend so as to cover the source structure SL and the insulating layer ILL.

The upper insulating layer UIL may be penetrated by a contact plug CT. The contact plug CT may be in contact with the protrusion of the first source layer SL1, and may extend in the direction opposite the direction in which the vertical insulating structure VI extends. The first source layer SL1 may be used as an ohmic contact layer between the contact plug CT and the second source layer SL2.

The upper wires L1 and L2 may include a metal source line L1 and power lines L2 spaced apart from the metal source line L1. The metal source line L1 may be electrically coupled to the first source layer SL1 via the contact plug CT. According to an embodiment of the present disclosure, the resistance of the source structure SL may be lowered through the first source layer SL1 having a lower resistivity than the second source layer SL2. Accordingly, there may be omitted a layer or a process to lower the resistance of the metal source line L1 coupled to the source structure SL in order to compensate for the resistance value of the source structure SL. The resistance value of the metal source line L1 is set depending on the area thereof. As the area of the metal source line L1 increases, the resistance of the metal source line L1 decreases, but the space required in order to dispose the power lines L2 is reduced. According to an embodiment of the present disclosure, a decrease in the resistance of the source structure SL reduces the area required for the metal source line L1, whereby the area in which the power lines L2 are disposed may be secured. Accordingly, an embodiment of the present disclosure may be advantageous to the downsizing of a semiconductor memory device. According to an embodiment, the power lines L2 may overlap the first gate stacked body GST1 and the second gate stacked body GST2 with the upper insulating layer UIL interposed between the power lines L2 and each of the first gate stacked body GST1 and the second gate stacked body GST2.

The power lines L2 may supply internal voltages, generated by receiving an external voltage, to the peripheral circuit PC illustrated in FIG. 1 and FIG. 2. According to an embodiment, the internal voltages supplied by the power lines L2 may include an internal supply voltage and an internal ground voltage.

Figure 6:
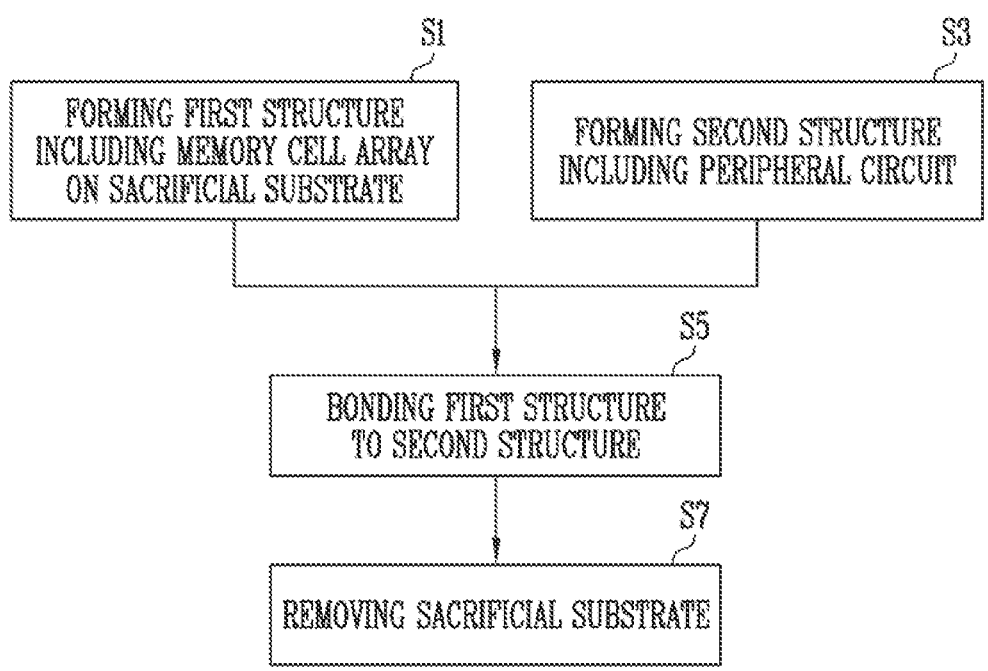
FIG. 6 is a flowchart schematically illustrating a method of manufacturing a semiconductor memory device according to an embodiment of the present disclosure.

FIG. 6 is a flowchart schematically illustrating a method of manufacturing a semiconductor memory device according to an embodiment of the present disclosure.

Referring to FIG. 6, the method of manufacturing a semiconductor memory device may include forming a first structure including a memory cell array on a sacrificial substrate at step S1, forming a second structure including a peripheral circuit at step S3, bonding the first structure and the second structure to each other at step S5, and removing the sacrificial substrate at step S7. Although not illustrated in the drawing, follow-up processes, such as forming upper wires and the like, may be performed after the sacrificial substrate is removed.

FIGS. 7A to 7C, FIGS. 8A to 8G, FIG. 9A, and FIG. 9B are views illustrating an embodiment for step S1 illustrated in FIG. 6. Although not illustrated in the drawings, step S1 may be performed on the supporter of a semiconductor manufacturing device.

Figure 7A:
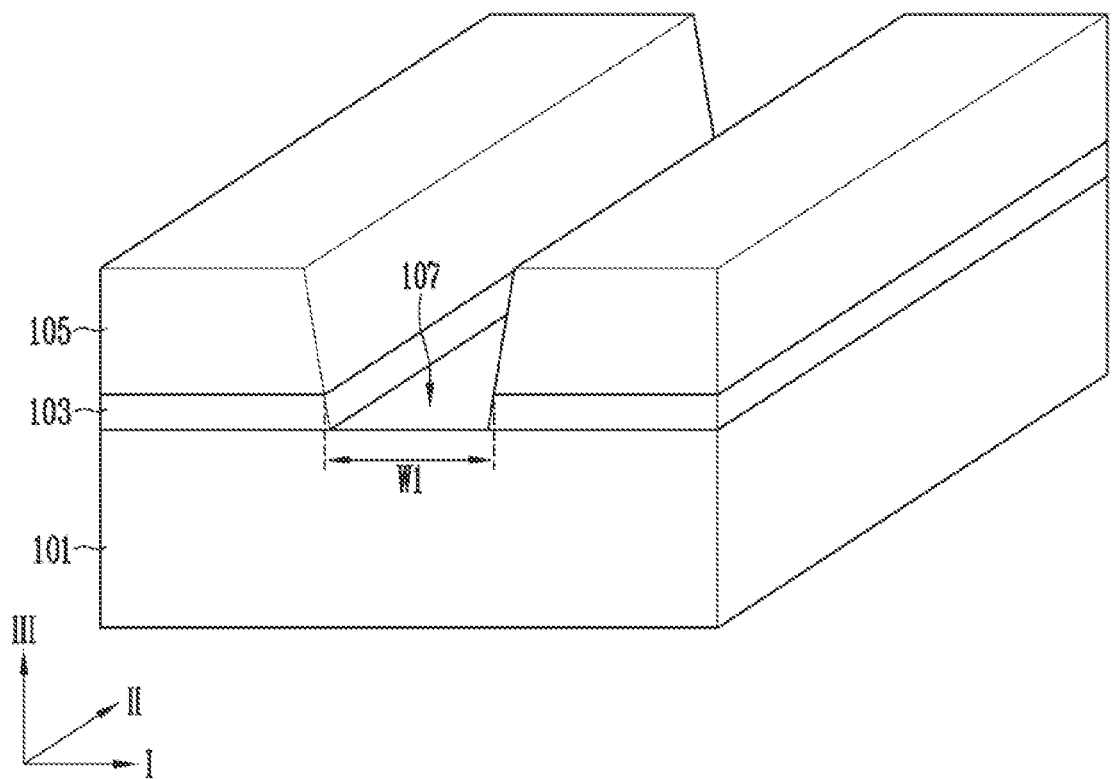
FIGS. 7A to 7C, FIGS. 8A to 8G, FIG. 9A, and FIG. 9B are views illustrating an embodiment for step S1 illustrated in FIG. 6.
Figure 7B:
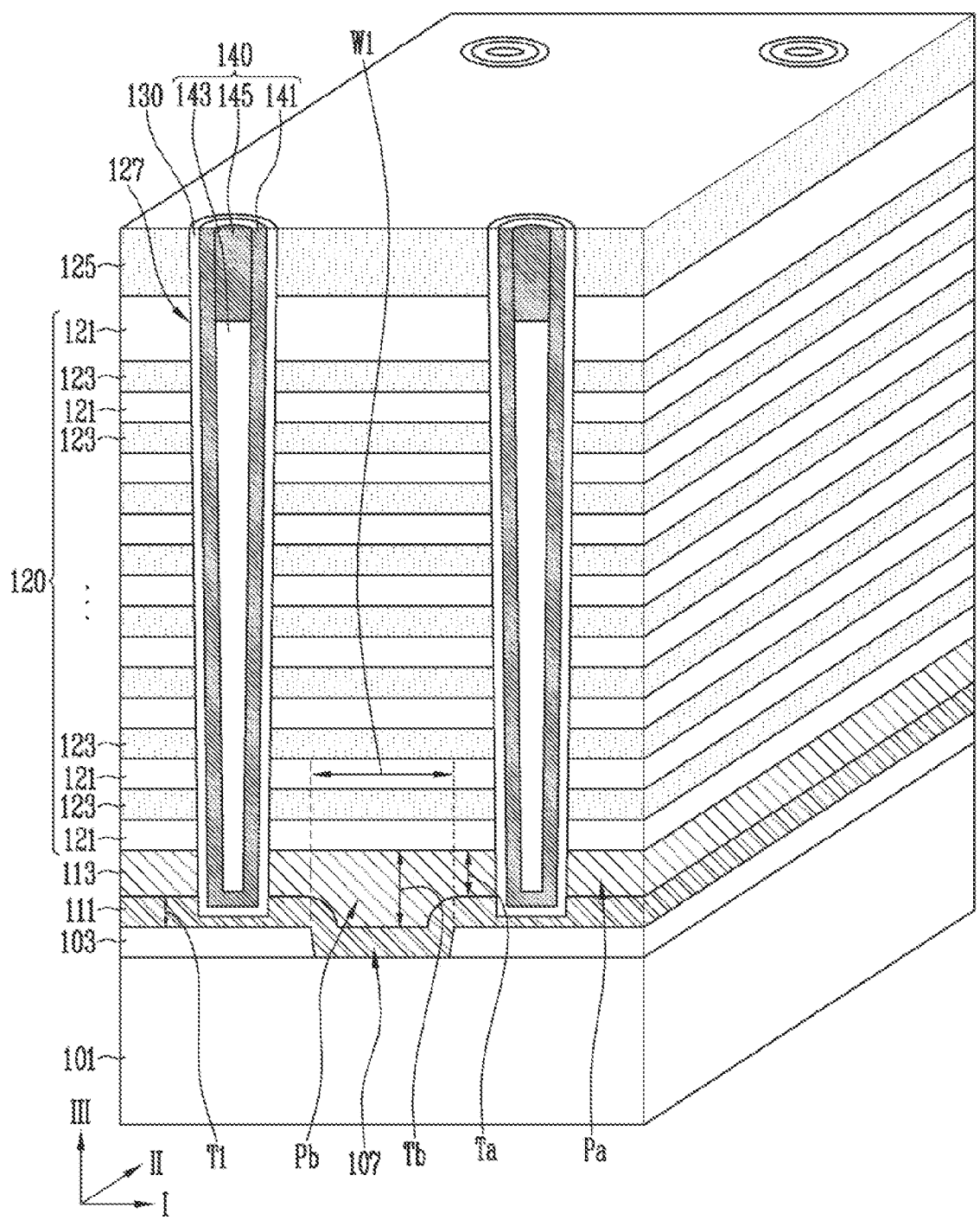
Figure 7C:
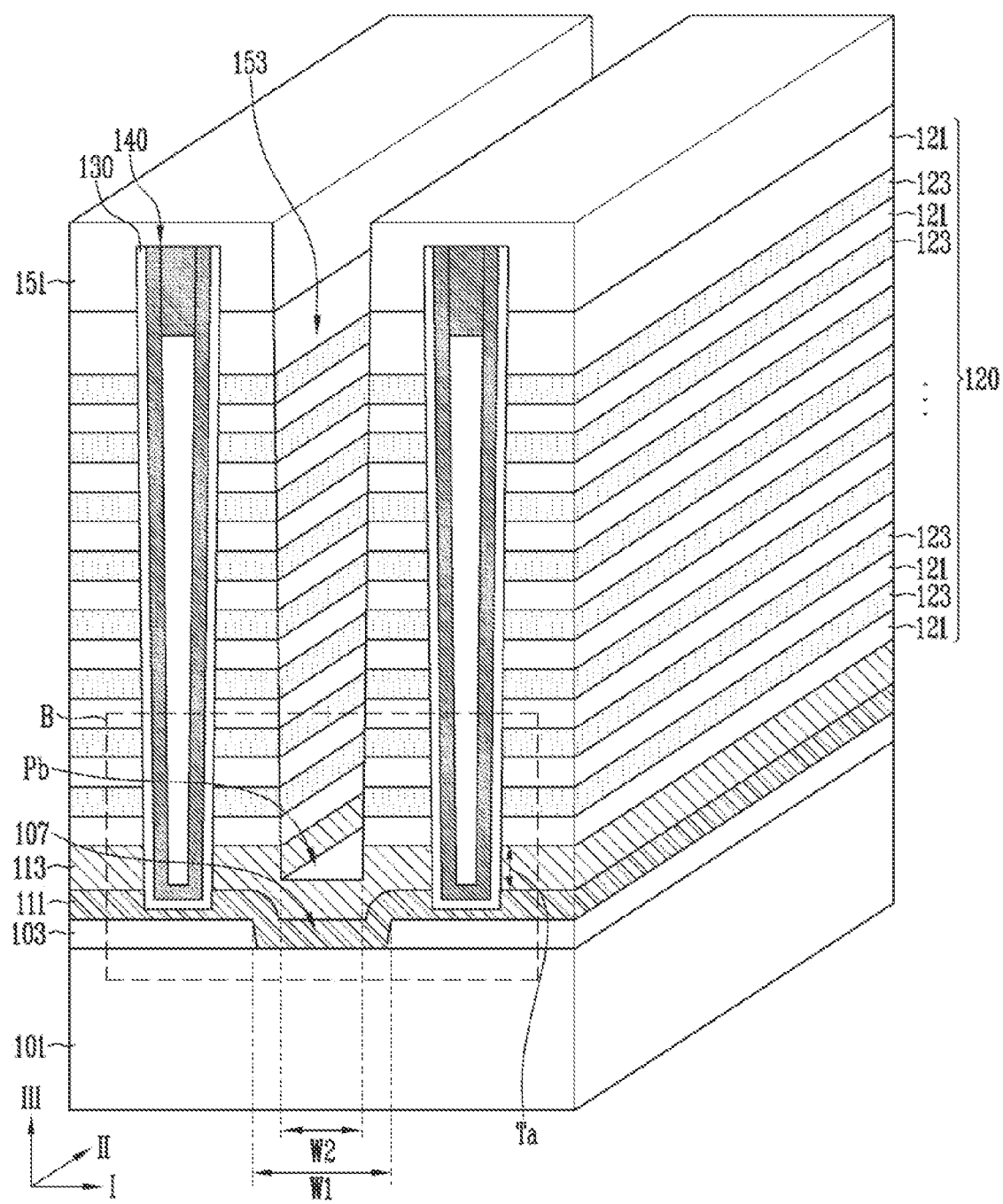

FIGS. 7A to 7C are perspective views illustrating some processes of step S1.

Referring to FIG. 7A, step S1 may include forming a first insulating layer 103 on the sacrificial substrate 101. The sacrificial substrate 101 may extend in a first direction I and a second direction II different from each other. In an embodiment an axis toward the first direction I and an axis toward the second direction II intersect with each other. According to an embodiment, the first direction I and the second direction II may be the direction of an X-axis and the direction of a Y-axis, respectively, in an XYZ Cartesian coordinate system. Hereinafter, the direction that is perpendicular to the plane extending in the first direction I and the second direction II is defined as a third direction III. The third direction III may be the direction of a Z-axis in the XYZ Cartesian coordinate system.

The sacrificial substrate 101 may be in contact with the supporter (not illustrated) of a manufacturing apparatus. According to an embodiment, the sacrificial substrate 101 may be a silicon substrate.

The first insulating layer 103 may include a material capable of functioning as a stop layer in the following process for removing the sacrificial substrate 101. According to an embodiment, the first insulating layer 103 may include a nitride layer.

Step S1 may include forming a mask pattern 105 on the first insulating layer 103 and etching the first insulating layer 103 using the mask pattern 105 as an etching barrier. Accordingly, a first opening 107 passing through the first insulating layer 103 may be formed. The first opening 107 may extend linearly. According to an embodiment, the first opening 107 may extend in the second direction II. A portion of the sacrificial substrate 101 may be exposed through the first opening 107. The first opening 107 may be formed with a first width W1.

Referring to FIG. 7B, the mask pattern 105 illustrated in FIG. 7A may be removed such that the first insulating layer 103 is exposed.

Subsequently, step S1 may include forming a first source layer 111 that covers the surface of the first opening 107 and the first insulating layer 103 and forming a sacrificial source layer 113 on the first source layer 111. The first source layer 111 may be in contact with the sacrificial substrate 101 through the first opening 107, and may extend over the first insulating layer 103.

The first source layer 111 may include a groove overlapping the first opening 107. The deposition thickness T1 of the first source layer 111 may be controlled such that a groove is defined on the surface of the first source layer 111. According to an embodiment, the deposition thickness T1 of the first source layer 111 may be controlled so as to be less than a value corresponding to ½ of the first width W1. A portion of the first source layer 111 overlapping the first opening 107 may have a curved shape in order to define the groove.

The sacrificial source layer 113 may be formed so as to fill the groove of the first source layer 111, and the surface thereof may be planarized. The sacrificial source layer 113 may include a first portion Pa overlapping the first insulating layer 103 and a second portion Pb extending from the first portion Pa and filling the groove of the first source layer 111. The first portion Pa may be formed with a first thickness Ta, and the second portion Pb may be formed with a second thickness Tb. According to an embodiment, the first thickness Ta may be controlled so as to be less than the first width W1. The second thickness Tb may be formed so as to be greater than the first thickness Ta. According to an embodiment of the present disclosure, the planarized sacrificial source layer 113 remains so as to fill the first opening 107 and the groove of the first source layer 111 overlapping the first opening 107. Accordingly, the second thickness Tb of the second portion Pb of the sacrificial source layer 113, which fills the groove defined on the surface of the first source layer 111, may be defined so as to be greater than the first thickness Ta of the first portion Pa of the sacrificial source layer 113 overlapping the first insulating layer 103.

The first source layer 111 may include a conductive material. According to an embodiment, the first source layer 111 may include a conductive material having a lower resistivity than silicon. The conductive material included in the first source layer 111 may function as an ohmic contact layer, and may have resistance to high temperature caused during the process of manufacturing the semiconductor memory device. In addition, the conductive material included in the first source layer 111 may have little or no loss while removing the sacrificial substrate 101 in the following process illustrated in FIG. 10B. According to an embodiment, the first source layer 111 may include at least one of a tungsten silicide layer and a cobalt silicide layer.

The sacrificial source layer 113 may include a material capable of functioning as a stop layer in the following process for forming the second opening 153 illustrated in FIG. 7C. The sacrificial source layer 113 may include a material that is selectively removable in the following process. According to an embodiment, the sacrificial source layer 113 may include undoped silicon.

Subsequently, step S1 may include forming a preliminary stacked body 120 on the sacrificial source layer 113 and forming a hole 127 passing through the preliminary stacked body 120 and the first portion Pa of the sacrificial source layer 113.

The preliminary stacked body 120 may be formed by alternately stacking interlayer insulating layers 121 and sacrificial layers 123 on the sacrificial source layer 113. The sacrificial layers 123 may include a material that is selectively removable in the following process, According to an embodiment, each of the interlayer insulating layers 121 may include a silicon oxide, and the sacrificial layers 123 may include a silicon nitride.

Forming the hole 127 may include forming a mask pattern 125 on the preliminary stacked body 120 and etching the preliminary stacked body 120 and the sacrificial source layer 113 through an etching process in which the mask pattern 125 is used as an etching barrier. The hole 127 may extend into the first source layer 111.

While the preliminary stacked body 120 is being etched, a ground voltage may be applied to the sacrificial substrate 101 from the supporter (not illustrated) of the manufacturing apparatus. Accordingly, while the preliminary stacked body 120 is being etched, charges accumulated in the first source layer 111 and the sacrificial source layer 113 may be discharged through the sacrificial substrate 101 via the first source layer 111.

In order to improve the degree of integration in the semiconductor memory device, the number of stacked interlayer insulating layers 121 and sacrificial layers 123 in the preliminary stacked body 120 may increase. In this case, a higher power may be applied to the manufacturing apparatus in order to perform the process of etching the preliminary stacked body 120. According to an embodiment of the present disclosure, even though high power is applied during the process of etching the preliminary stacked body 120, charges accumulated by the high power may be discharged through the first source layer 111, which is in contact with the sacrificial substrate 101, whereby an arcing phenomenon may be prevented. In other words, an embodiment of the present disclosure may enable charges, generated while the preliminary stacked body 120 is being etched, to be discharged through the first source layer 111. Accordingly, the present disclosure may omit an additional structure for discharging, whereby the process of manufacturing the semiconductor memory device may be simplified.

Subsequently, step S1 may include forming a memory layer 130 on the surface of the hole 127 and forming a channel structure 140, which fills the hole 127, on the memory layer 130.

Figure 8A:
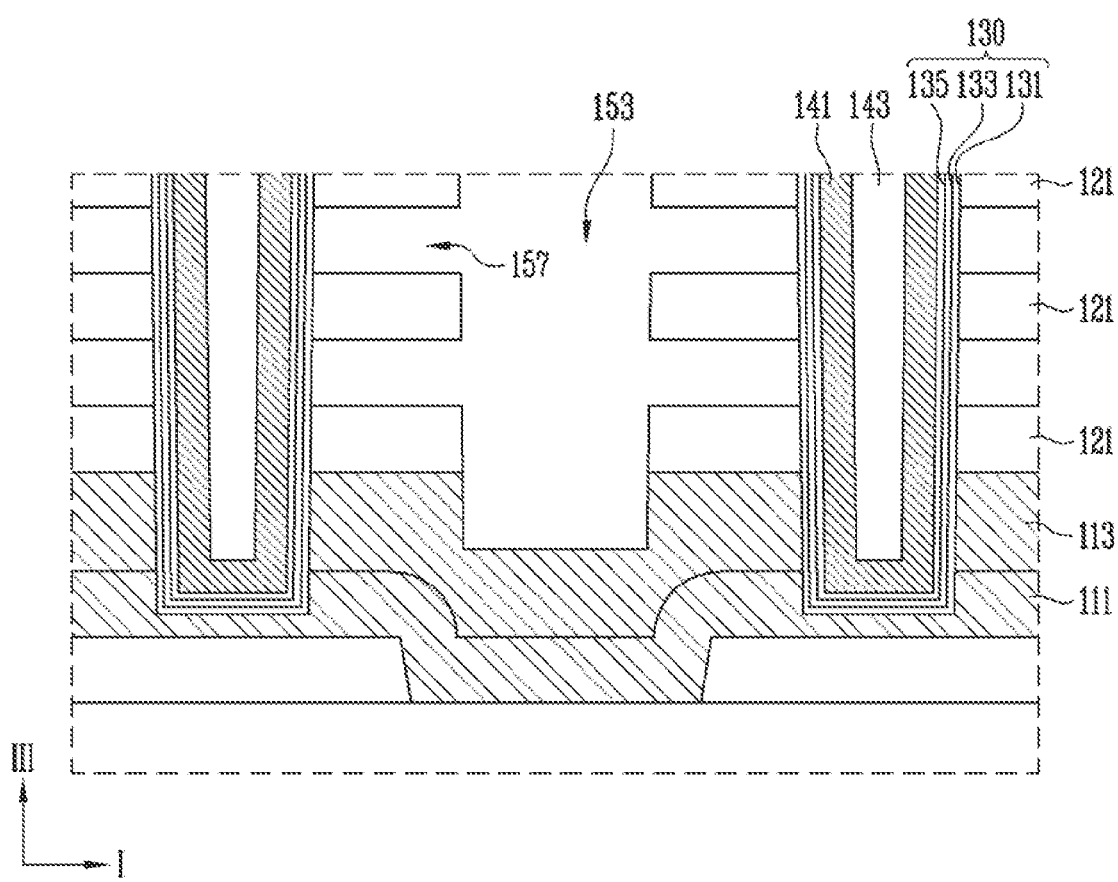

The memory layer 130 may include the first block insulating layer 131, the data storage layer 133, and the tunnel insulating layer 135 illustrated in FIG. 8A, The first blocking insulating layer 131, the data storage layer 133, and the tunnel insulating layer 135 may include the same materials as the first blocking insulating layer BI1, the data storage layer DS, and the tunnel insulating layer TI illustrated in FIG. 4B.

Forming the channel structure 140 may include forming a channel layer 141 on the surface of the memory layer 130 and filling the central region of the hole 127 opened by the channel layer 141 with a core insulating layer 143 and a doped semiconductor pattern 145. The channel layer 141 may include a semiconductor layer. According to an embodiment, the channel layer 141 may include undoped silicon. According to an embodiment, a portion of the channel layer 141 surrounding the doped semiconductor pattern 145 may include the same dopant as the dopant of the doped semiconductor pattern 145. According to an embodiment, the doped semiconductor pattern 145 may include n-type doped silicon.

Referring to FIG. 7C, after the mask pattern 125 illustrated in FIG. 7B is removed, a second insulating layer 151 covering the channel structure 140 may be formed.

Subsequently, step S1 may include forming the second opening 153 passing through the second insulating layer 151 and the preliminary stacked body 120. The second opening 153 may extend linearly. According to an embodiment, the second opening 153 may extend in the second direction II.

The second opening 153 may overlap the second portion Pb of the sacrificial source layer 113. According to an embodiment of the present disclosure, because the second portion Pb of the sacrificial source layer 113 is formed so as to be relatively thicker than another portion, when the etching process for forming the second opening 153 is performed, the second portion Pb may be prevented from being completely penetrated. Accordingly, the present disclosure may prevent the first source layer 111 from being damaged while the second opening 153 is being formed.

A second width W2 of the second opening 153 may be set in consideration of the alignment margin between the second opening 153 and the second portion Pb and the thickness of material layers deposited on the sidewall of the second opening 153 in the following process. According to an embodiment, the second opening 153 may be formed with the second width W2 being is less than the first width W1 of the first opening 107.

According to an embodiment, the second width W2 of the second opening 153 may be formed so as to be greater than the first thickness Ta corresponding to the gap distance between the preliminary stacked body 120 and the first source layer 111. Accordingly, in the following process in which the sacrificial source layer 113 is replaced with a second source layer, a void may be prevented from being generated in the second source layer.

FIGS. 8A to 8G are enlarged cross-sectional views of an area B illustrated in FIG. 7C and illustrate an embodiment for the processes following the process illustrated in FIG. 7C.

Referring to FIG. 8A, step S1 may include selectively removing the sacrificial layers 123 illustrated in FIG. 7C through the second opening 153. Accordingly, third openings 157 may be defined between the interlayer insulating layers 121 adjacent to each other in the third direction III.

Figure 8B:
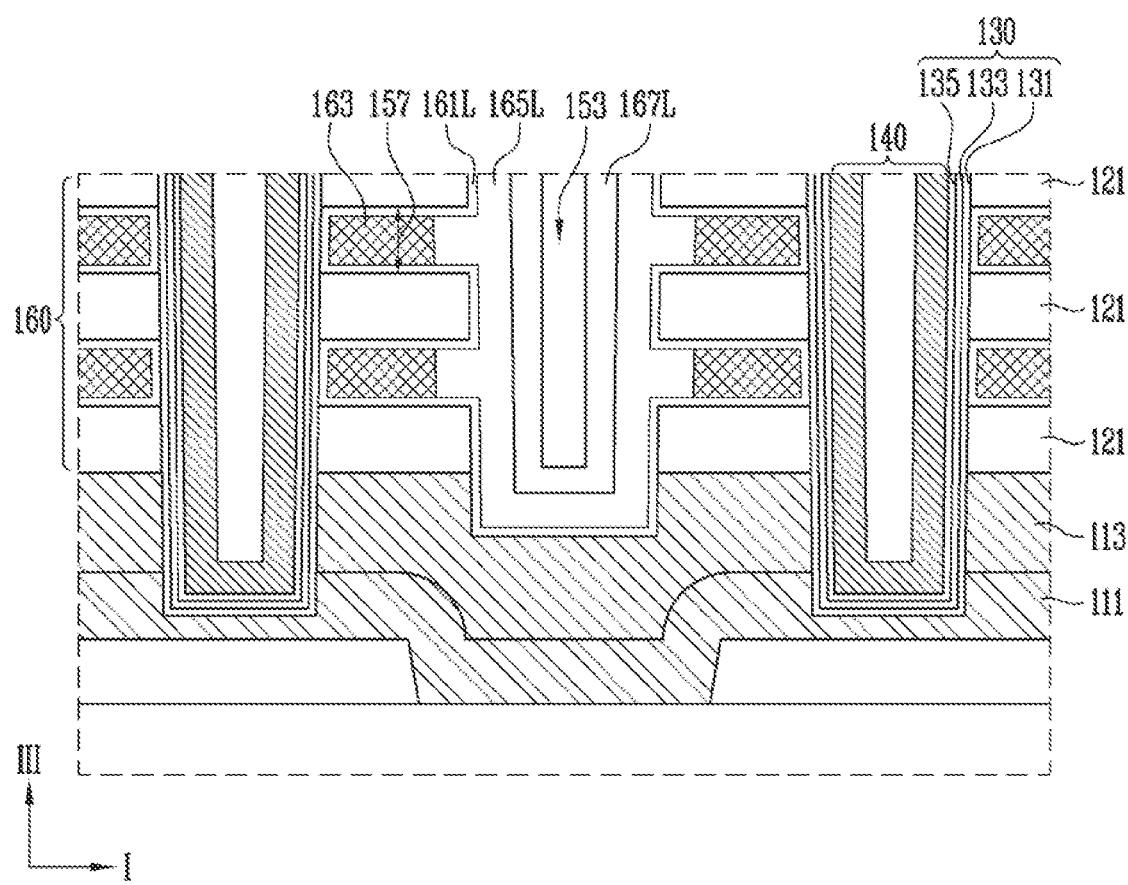

Referring to FIG. 8B, step S1 may include filling the third openings 157 with conductive patterns 163. Filling the third openings 157 with the conductive patterns 163 may include forming a conductive material through the second opening 153 so as to fill the third openings 157 and etching the conductive material such that the conductive material is separated into the plurality of conductive patterns 163. Each of the conductive patterns 163 may be formed of various conductive materials by including a metal barrier layer and a metal layer, including a silicon layer and a metal silicide layer, or including at least one of a metal layer, a silicon layer, and a metal silicide layer. The conductive patterns 163 may extend so as to surround the sidewall of the channel structure 140 with the memory layer 130 interposed therebetween.

According to an embodiment, step S1 may include forming a preliminary second blocking insulating layer 161L before filling the third openings 157 with the conductive patterns 163. The conductive patterns 163 may fill the third openings 157 on the preliminary second blocking insulating layer 161L.

The preliminary second blocking insulating layer 161L may extend over the surface of the sacrificial source layer 113 coplanar with the bottom surface of the second opening 153. The preliminary second blocking insulating layer 161L may include an insulating material having a higher dielectric constant than the first blocking insulating layer 131. The preliminary second blocking insulating layer 161L may extend so as to surround the sidewall of the channel structure 140 with the memory layer 130 interposed between the preliminary second blocking insulating layer 161L and the channel structure 140.

Through the processes described above with reference to FIG. 8A and FIG. 8B, the sacrificial layers 123 illustrated in FIG. 7C are replaced with the conductive patterns 163, whereby a gate stacked body 160 may be defined. The gate stacked body 160 may include the conductive patterns 163 and the interlayer insulating layers 121 that are alternately disposed while surrounding the channel structure 140.

Subsequently, a preliminary spacer insulating layer 165L and a protection layer 167L may be sequentially formed along the surface of the second opening 153 so as to cover the sidewall of the gate stacked body 160. The preliminary spacer insulating layer 165L and the protection layer 167L may extend so as to cover the sidewall of the second insulating layer 151 illustrated in FIG. 7C. The preliminary spacer insulating layer 165L may include a material that is different from the material included in the protection layer 167L. According to an embodiment, the preliminary spacer insulating layer 165L may include a nitride layer, and the protection layer 167L may include an oxide layer.

Figure 8C:
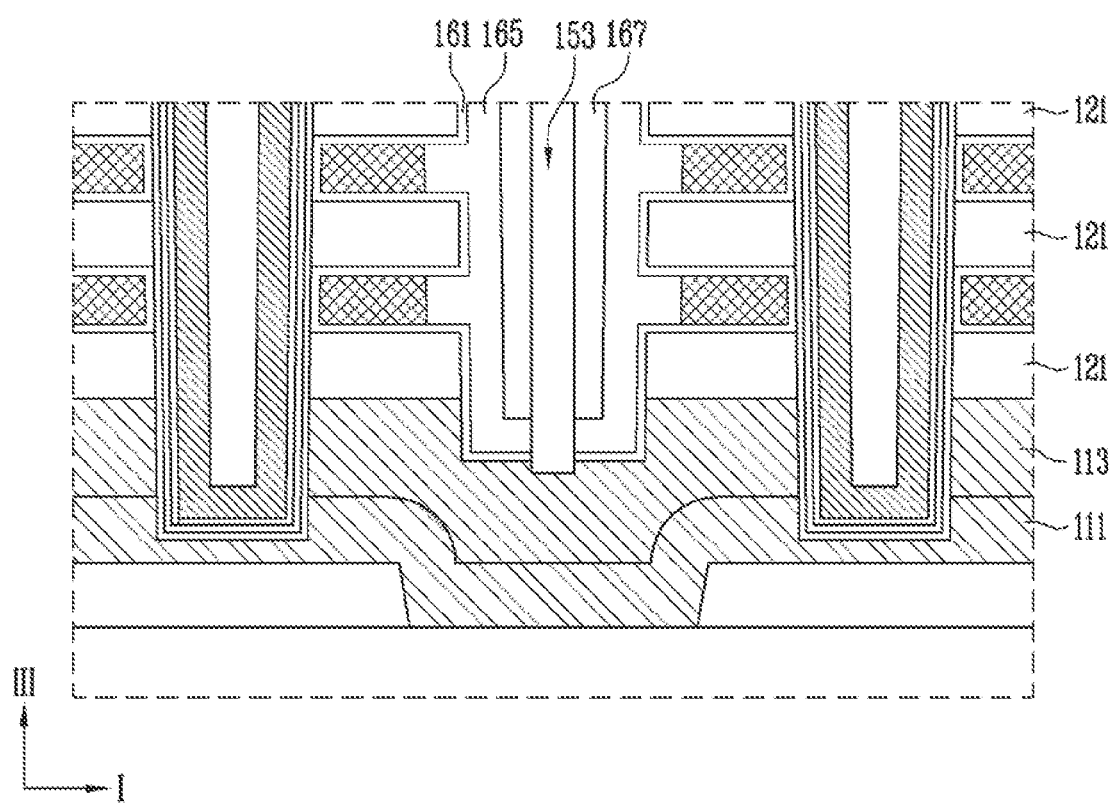

Referring to FIG. 8C, a portion of each of the protection layer 167L, the preliminary spacer insulating layer 165L, and the preliminary second blocking insulating layer 161L illustrated in FIG. 8B may be etched using an etching process such as etch-back or the like. Accordingly, the sacrificial source layer 113 may be exposed through the bottom surface of the second opening 153. Hereinafter, the remaining portions of the protection layer 167L, the preliminary spacer insulating layer 165L, and the preliminary second blocking insulating layer 161L are referred to as a protective pattern 167, a spacer insulating layer 165, and a second blocking insulating layer 161, respectively.

Figure 8D:
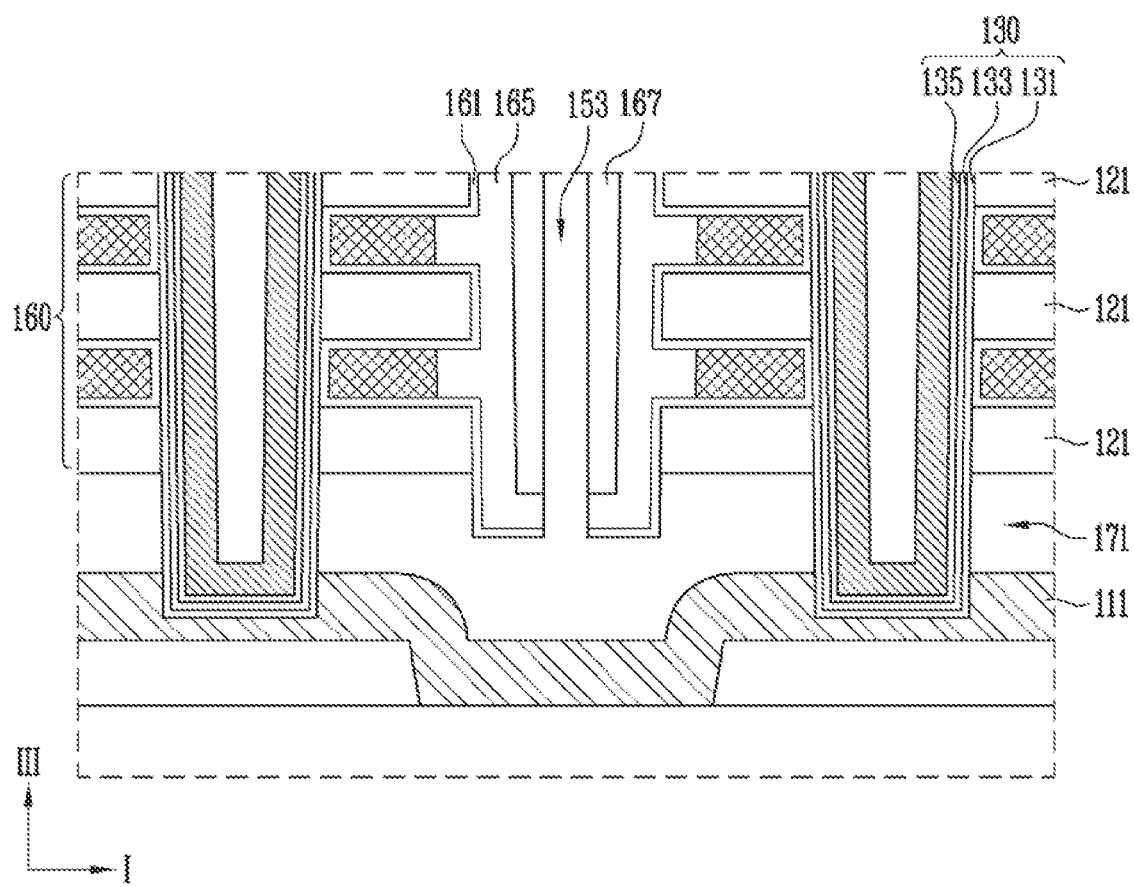

Referring to FIG. 8D, step S1 may include selectively removing the sacrificial source layer 113 illustrated in FIG. 8C through the second opening 153 such that the memory layer 130 is exposed. A fourth opening 171 may be defined between the gate stacked body 160 and the first source layer 111 by removing the sacrificial source layer 131.

Figure 8E:
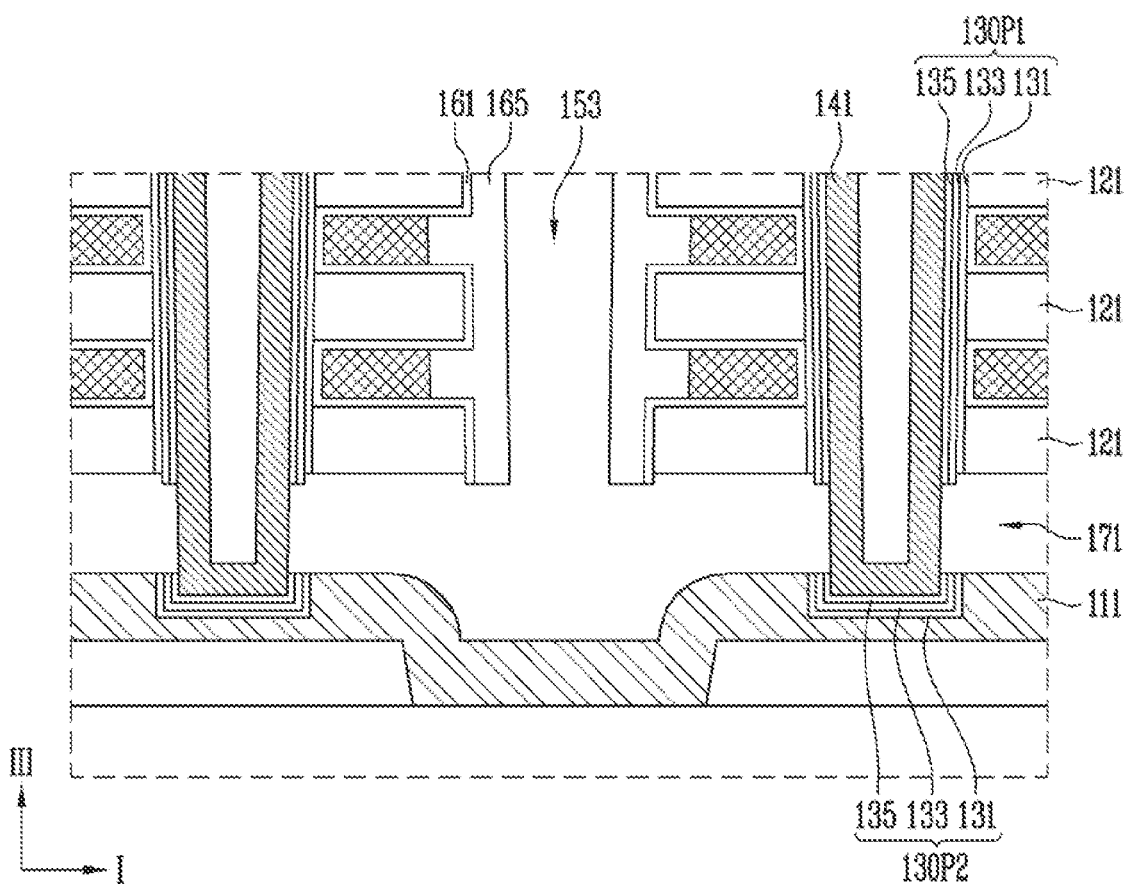

Referring to FIG. 8E, step S1 may include removing a portion of the memory layer exposed through the fourth opening 171 such that the channel layer 141 of the channel structure is exposed. Accordingly, the memory layer may be separated into a first memory pattern 130P1 and a second memory pattern 130P2.

Removing a portion of the memory layer may include etching a portion of the first blocking insulating layer 131 using an anisotropic etching method, etching a portion of the data storage layer 133 using a wet etching method, and etching a portion of the tunnel insulating layer 135 using an anisotropic etching method. While a portion of the first blocking insulating layer 131 is being etched, a portion of the protective pattern 167 illustrated in FIG. 8D may be etched. While a portion of the data storage layer 133 is being etched, a portion of the spacer insulating layer 165 and a portion of the second blocking insulating layer 161 may be etched. The protective pattern 167 illustrated in FIG. 8D may function as an etching barrier while a portion of the data storage layer 133 is being etched. The protective pattern 167 illustrated in FIG. 8D may be removed while a portion of the tunnel insulating layer 135 is being etched. The spacer insulating layer 165 may function as an etching barrier while a portion of the tunnel insulating layer 135 is being etched.

Figure 8F:
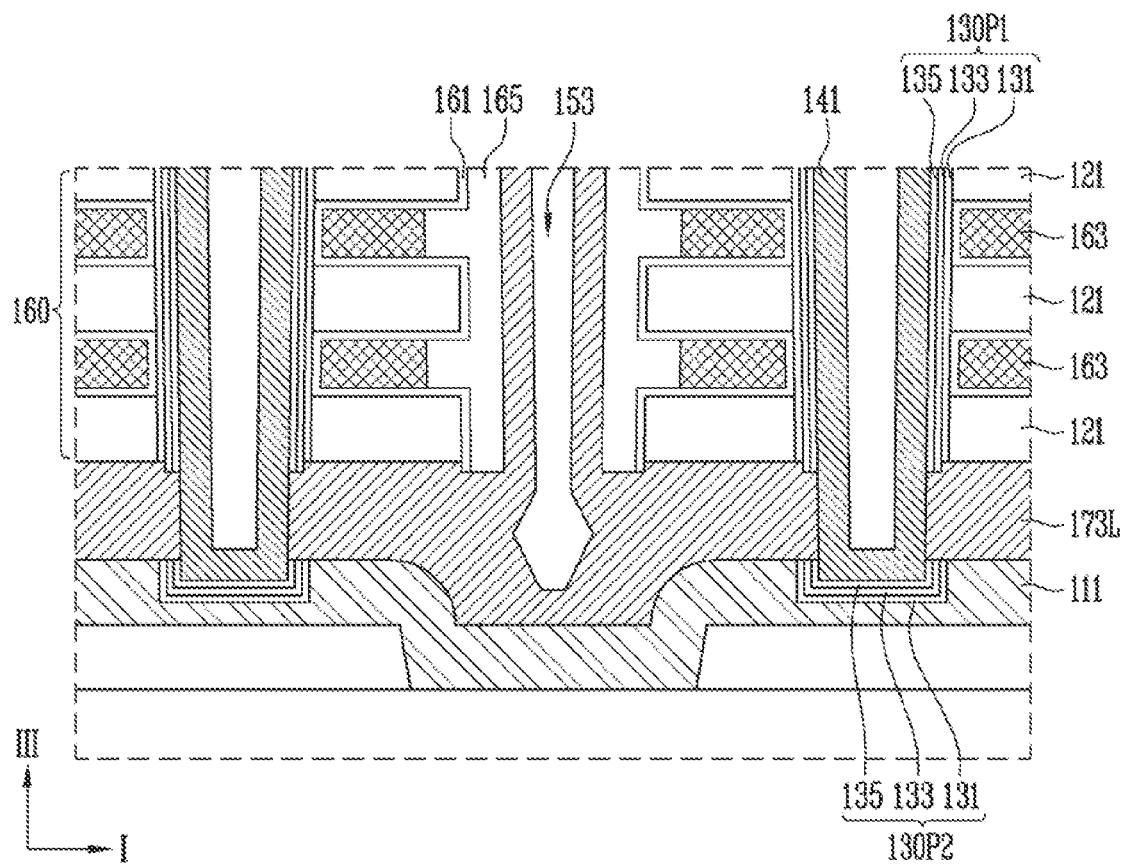

Referring to FIG. 8F, step S1 may include forming a preliminary source layer 173L. The preliminary source layer 173L may fill the fourth opening 171 illustrated in FIG. 8E and to be in contact with the channel layer 141 of the channel structure. The preliminary source layer 173L may include a doped semiconductor layer. According to an embodiment, the preliminary source layer 173L may include n-type doped silicon. A dopant inside the preliminary source layer 173L may be activated by a thermal process. According to an embodiment, a thermal process causes the dopant to diffuse from the preliminary source layer 173L into a portion of the channel layer 141 surrounded by the preliminary source layer 173L, whereby the portion of the channel layer 141 may be doped.

The preliminary source layer 173L may replace the first portion Pa of the sacrificial source layer 113 that is formed so as to be relatively thin as described above with reference to FIG. 7B. Accordingly, an embodiment of the present disclosure may prevent a void from being formed in the preliminary source layer 173L between the gate stacked body 160 and the first source layer 111.

According to an embodiment, the preliminary source layer 173L may be formed by repeating the process of depositing a doped semiconductor layer and the process of etching the doped semiconductor layer at least once.

Figure 8G:
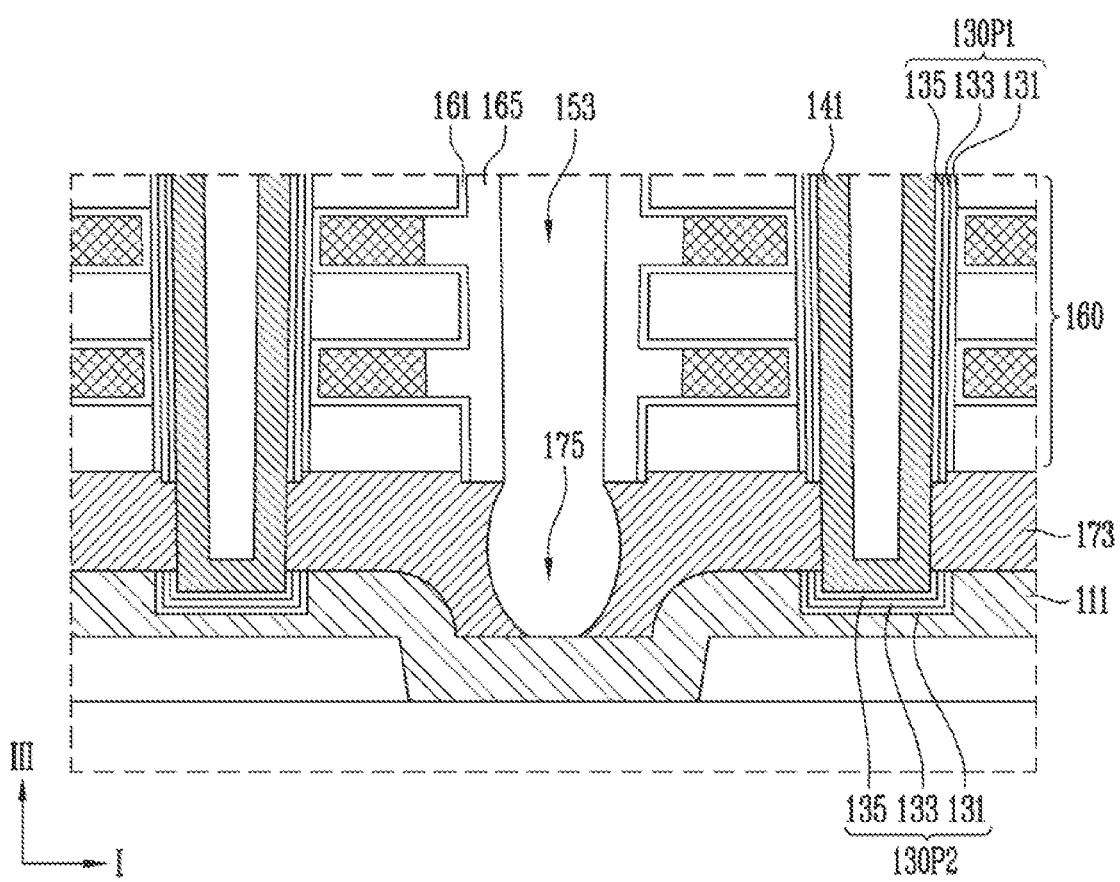

Referring to FIG. 8G, step S1 may include etching the preliminary source layer 173L illustrated in FIG. 8F such that the preliminary source layer 173L illustrated in FIG. 8F remains as the second source layer 173 between the gate stacked body 160 and the first source layer 111. Accordingly, a fifth opening 175 may be defined. The fifth opening 175 may be coupled to the second opening 153 and may extend into the second source layer 173.

According to an embodiment, the preliminary source layer 173L may be etched such that the spacer insulating layer 165 is exposed. According to an embodiment, the fifth opening 175 may expose the first source layer 111. An embodiment of the present disclosure is not limited thereto. According to an embodiment, the second source layer 173 may extend along the bottom surface of the fifth opening 175, and the fifth opening 175 may be spaced apart from the first source layer 111 by the second source layer 173.

Through the processes described above with reference to FIGS. 8C to 8G, the sacrificial source layer may be replaced with the second source layer 173 that is in contact with the channel layer 141 of the channel structure.

Figure 9A:
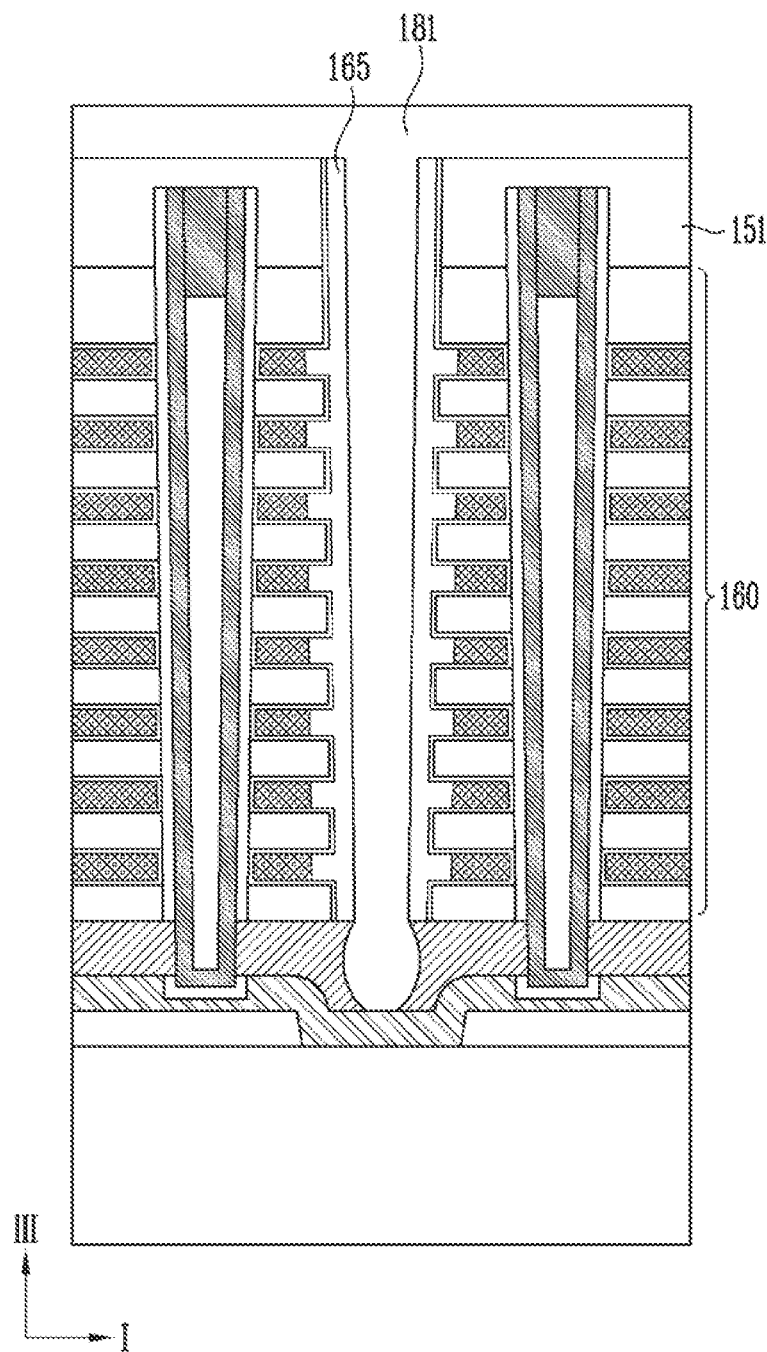
Figure 9B:
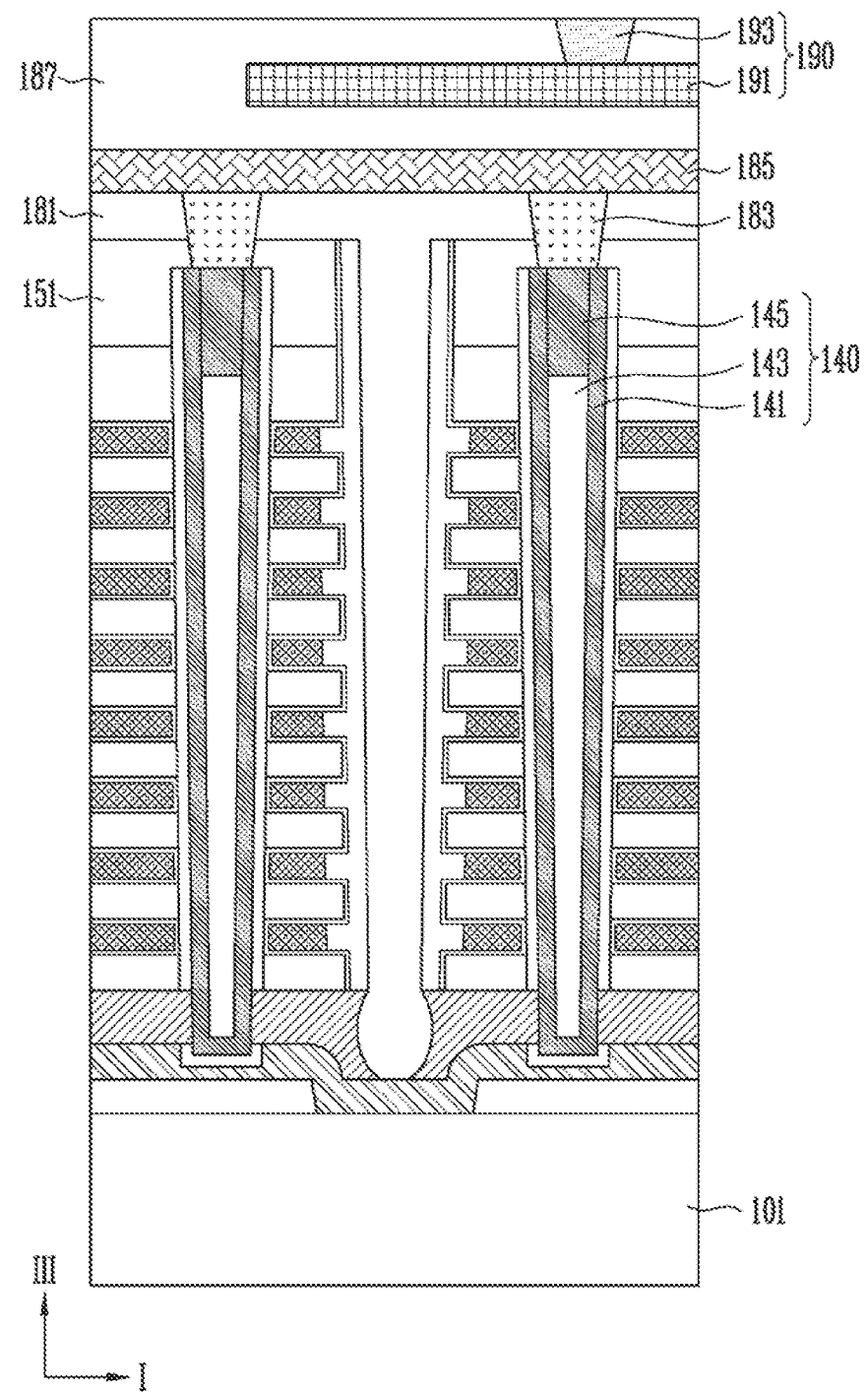

FIG. 9A and FIG. 9B are cross-sectional views illustrating an embodiment for the following processes after the process illustrated in FIG. 8G.

Referring to FIG. 9A, the second opening 153 and the fifth opening 175 illustrated in FIG. 8G may be filled with a third insulating layer 181. The third insulating layer 181 may extend over the second insulating layer 151. The third insulating layer 181 may include an oxide layer. According to an embodiment, the spacer insulating layer 165 may remain between the third insulating layer 181 and the gate stacked body 160. The spacer insulating layer 165 may extend between the sidewall of the second insulating layer 151 and the third insulating layer 181.

Referring to FIG. 9B, step S1 may include forming a drain contact plug 183 penetrating the second insulating layer 151 and the third insulating layer 181, forming a bit line 185 coupled to the drain contact plug 183, and forming a first interconnection structure 190 on the bit line 185.

The drain contact plug 183 may extend so as to be in contact with the channel structure 140. The drain contact plug 183 may be in contact with at least one of the channel layer 141 of the channel structure 140 and the doped semiconductor pattern 145 of the channel structure 140. The contact structure between the drain contact plug 183 and the channel structure 140 may be various without limitation to what is illustrated in the drawing. The structure of the drain contact plug 183 may be various without limitation to what is illustrated in the drawing.

The bit line 185 may be coupled to the channel structure 140 via the drain contact plug 183. The contact structure between the bit line 185 and the drain contact plug 183 may be various without limitation to what is illustrated in the drawing.

The first interconnection structure 190 may be embedded in a first insulating structure 187 formed on the bit line 185. The first insulating structure 187 may include two or more insulating layers. The first interconnection structure 190 may be embodied in various ways without limitation to what is illustrated in the drawing. The first interconnection structure 190 may include a first coupling structure 191 overlapping the bit line 185 and a first bonding pattern 193 coupled to the first coupling structure 191.

Figure 10A:
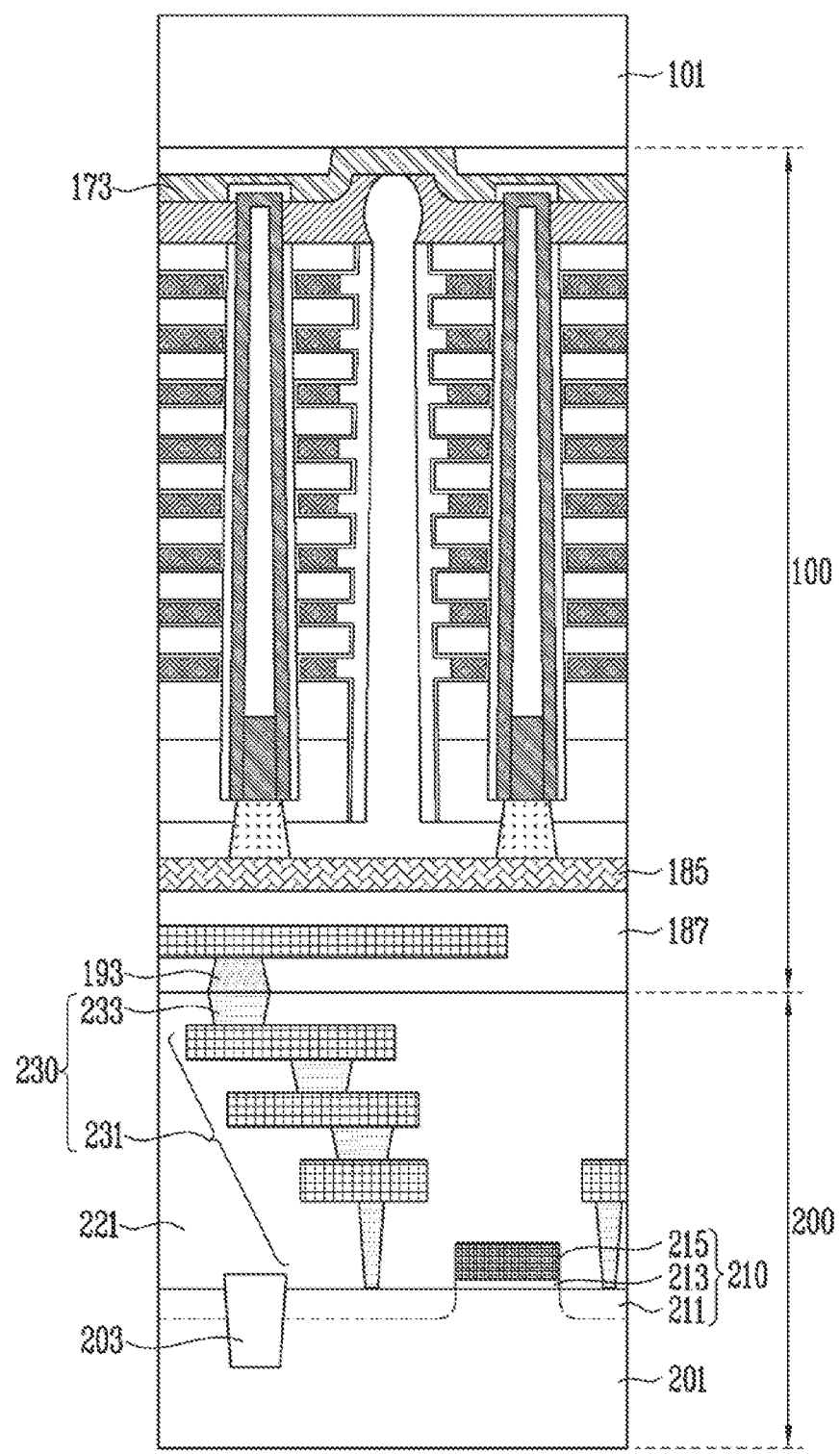
FIG. 10A and FIG. 10B are cross-sectional views illustrating an embodiment for steps S5 and S7 illustrated in FIG. 6.
Figure 10B:
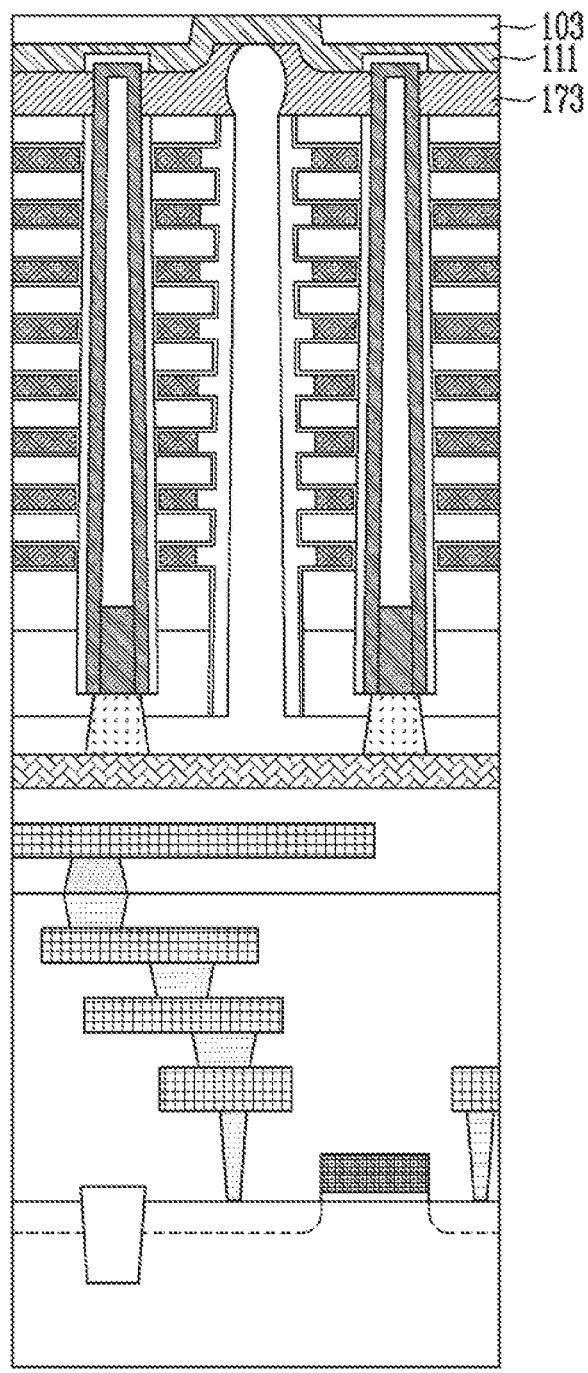

FIG. 10A and FIG. 10B are cross-sectional views illustrating an embodiment for steps S5 and S7 illustrated in FIG. 6.

Referring to FIG. 10A, step S5 may include bonding the first bonding pattern 193 of a first structure 100 to the second bonding pattern 233 of a second structure 200 after the first structure 100 formed on one surface of the sacrificial substrate 101 is arranged on the second structure 200 provided through step S3 illustrated in FIG. 6A.

The first structure 100 may be formed through the processes described above with reference to FIGS. 7A to 7C, FIGS. 8A to 8G, FIG. 9A, and FIG. 9B.

The second structure 200 may include a peripheral circuit substrate and a second interconnection structure 230 on the peripheral circuit substrate. The peripheral circuit substrate may include a substrate 201 having a well region, an isolation insulating layer 203 isolating the active regions of the substrate 201, and transistors 210 insulated from each other by the isolation insulating layer 203. Each of the transistors 210 may include junctions 211 formed in the active region of the substrate 201, a gate insulating layer 213 stacked on the active region of the substrate 201, and a gate electrode 215 stacked on the gate insulating layer 215. The junctions 211 may be defined by injecting at least one of an n-type dopant and a p-type dopant into the active region on the opposite sides of the gate electrode 215.

The peripheral circuit substrate may be covered by a second insulating structure 221. The second insulating structure 221 may include two or more insulating layers.

The second interconnection structure 230 may be embedded in the second insulating structure 221. The second interconnection structure 230 may include a second coupling structure 231, electrically coupled to the peripheral circuit substrate, and the second bonding pattern 233.

The first bonding pattern 193 and the second bonding pattern 233 may include metals that are capable of being combined with each other by an intermetallic bonding process. According to an embodiment, each of the first bonding pattern 193 and the second bonding pattern 233 may include copper.

According to an embodiment of the present disclosure, after the dopant inside the second source layer 173 is activated, the first bonding pattern 193 is bonded to the second bonding pattern 233. Accordingly, even though a process temperature is limited after the first bonding pattern 193 is bonded to the second bonding pattern 233, a thermal process for activating the dopant may be omitted, whereby the reliability of the operation of the semiconductor memory device may be stably secured.

Referring to FIG. 10B, the sacrificial substrate 101 illustrated in FIG. 10A is removed through step S7, whereby the first source layer 111 and the first insulating layer 103 may be exposed. According to an embodiment, the sacrificial substrate 101 may be removed using at least one of a Chemical Mechanical Polishing (CMP) method and a wet etching method.

The first insulating layer 103 may function as an etching stop layer when the sacrificial substrate 101 illustrated in FIG. 10A is removed. Accordingly, while the sacrificial substrate 101 is being removed, the first source layer 111 may be prevented from being excessively damaged.

Figure 11:
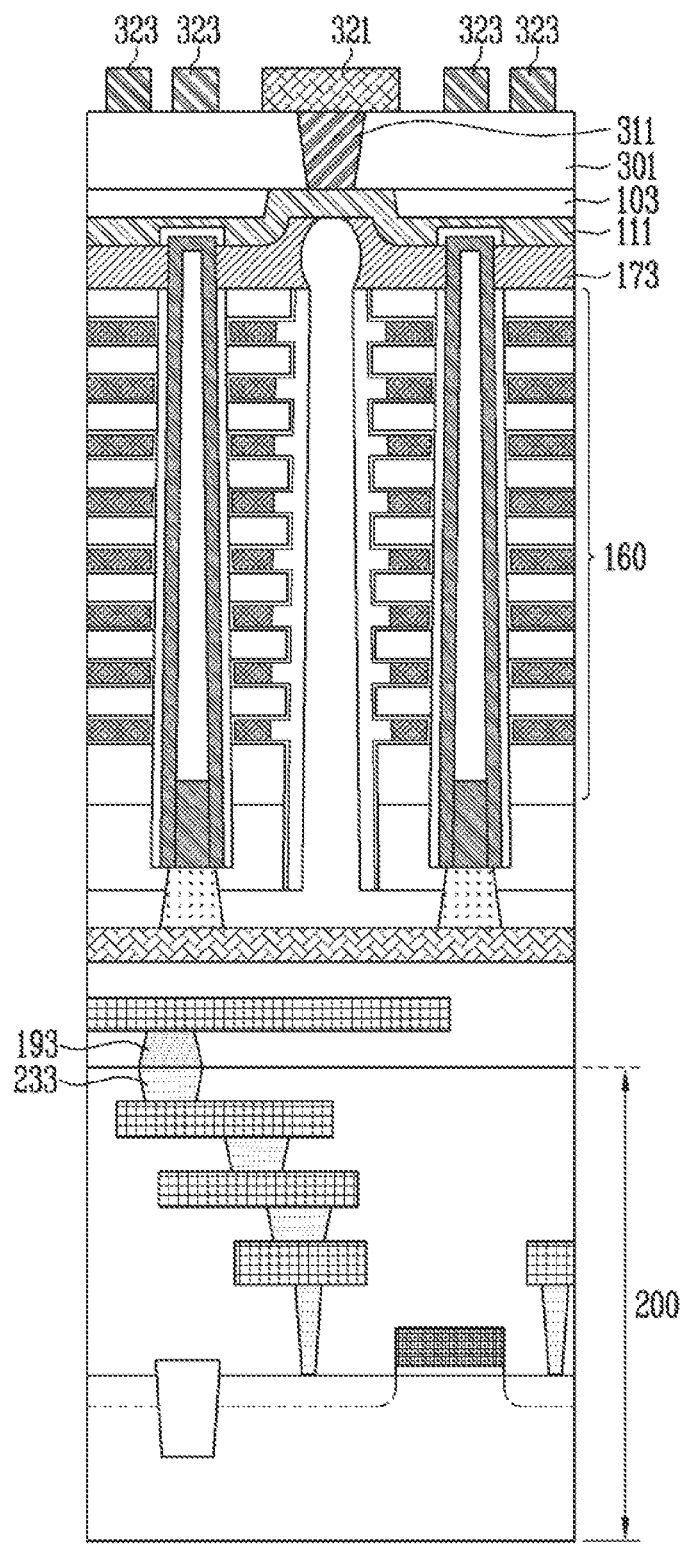
FIG. 11 is a cross-sectional view illustrating an embodiment for a follow-up process performed after step S7 illustrated in FIG. 6.

FIG. 11 is a cross-sectional view illustrating an embodiment for the follow-up process performed after step S7 illustrated in FIG. 6.

Referring to FIG. 11, after the sacrificial substrate is removed, an upper insulating layer 301 may be formed. The upper insulating layer 301 may overlap the second structure 200 and the gate stacked body 160 with the first source layer 111 and the first insulating layer 103 interposed between the upper insulating layer 301 and the second structure 200.

Subsequently, a contact plug 311 may be formed. The contact plug 311 may penetrate the upper insulating layer 301 to come in contact with the first source layer 111. The contact plug 311 may include various type of metal.

According to an embodiment of the present disclosure, the first source layer 111 may have a lower resistivity than the second source layer 173, and may provide an ohmic contact layer. Accordingly, the present disclosure may compensate for the resistance of the second source layer 173 through the first source layer 111, and the first source layer 111 may be used as an ohmic contact layer between the second source layer 173 and the contact plug 311.

The first source layer 111 for the ohmic contact layer may be formed through a silicide process performed in the range of a temperature higher than a process temperature limited after the bonding process. According to the present disclosure, the first source layer 111 used as the ohmic contact layer is formed before the first bonding pattern 193 is bonded to the second bonding pattern 233. Therefore, the first source layer 111 may be stably formed without limitation as to the process temperature.

Subsequently, forming a metal source line 321 that is in contact with the contact plug 311 and forming power lines 323 that are spaced apart from the metal source line 321 and overlap the gate stacked body 160 may be performed. The upper insulating layer 301 and the first insulating layer 103 may be disposed between the power lines 323 and the gate stacked body 160. Although not illustrated in the drawing, after an insulating layer that extends so as to cover the metal source line 321 is additionally formed, the power lines 323 may be disposed on the insulating layer.

Figure 12:
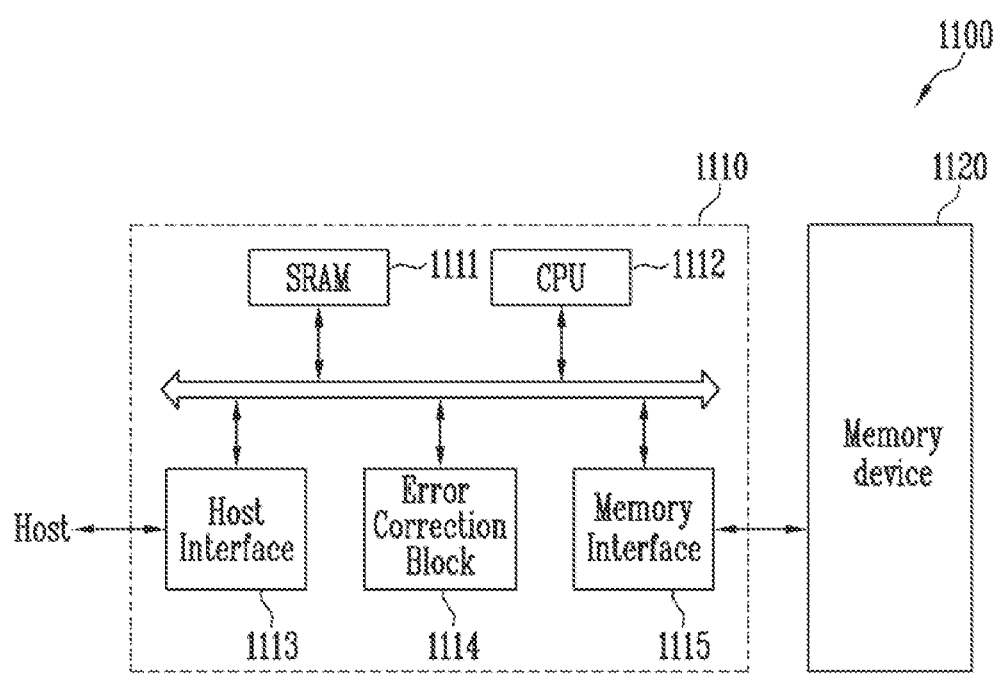
FIG. 12 is a block diagram illustrating a configuration of a memory system according to an embodiment of the present disclosure.

FIG. 12 is a block diagram illustrating a configuration of a memory system according to an embodiment of the present disclosure.

Referring to FIG. 12, the memory system 1100 includes a memory device 1120 and a memory controller 1110.

The memory device 1120 may include a gate stacked body surrounding a channel structure, a first source layer overlapping the gate stacked body and having a protrusion, and a second source layer disposed between the gate stacked body and the first source layer and coming in contact with the channel layer of the channel structure.

The memory device 1120 may be a multi-chip package configured with a plurality of flash memory chips.

The memory controller 1110 is configured to control the memory device 1120, and may include Static Random Access Memory (SRAM) 1111, a Central Processing Unit (CPU) 1112, a host interface 1113, an error correction block 1114, and a memory interface 1115. The SRAM 1111 is used as the operating memory of the CPU 1112, the CPU 1112 performs an overall control operation for data exchange of the memory controller 1110, and the host interface 1113 has the data exchange protocol of a host coupled to the memory system 1100. Also, the error correction block 1114 detects and corrects errors included in data read from the memory device 1120, and the memory interface 1115 performs interfacing with the memory device 1120. Additionally, the memory controller 1110 may further include Read Only Memory (ROM) configured to store code data for interfacing with the host, and the like.

Figure 13:
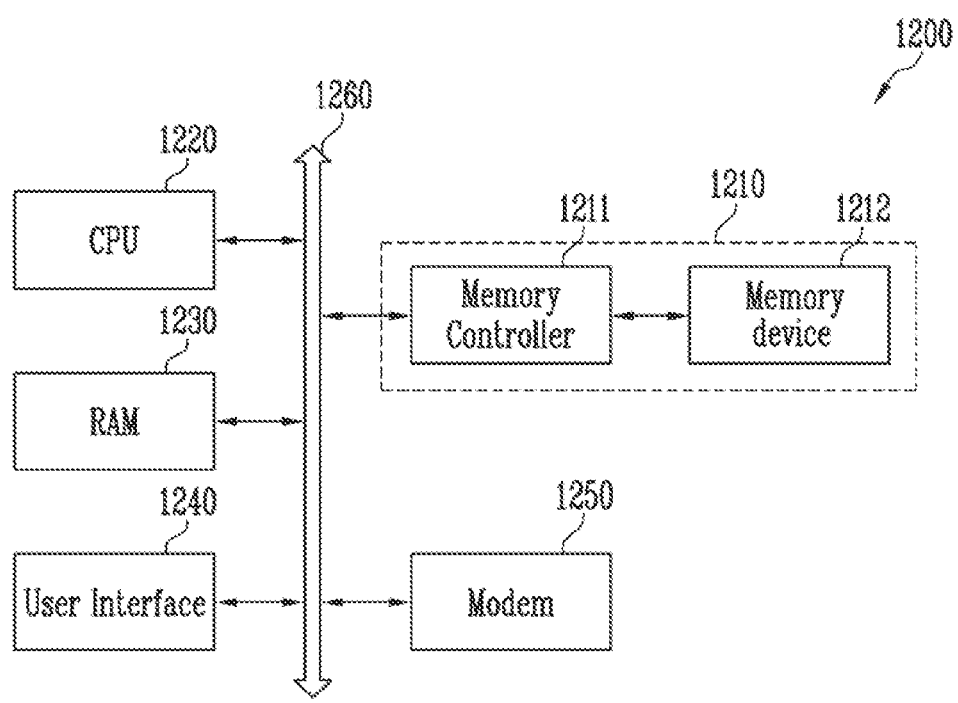
FIG. 13 is a block diagram illustrating a configuration of a computing system according to an embodiment of the present disclosure.

FIG. 13 is a block diagram illustrating a configuration of a computing system according to an embodiment of the present disclosure.

Referring to FIG. 13, the computing system 1200 according to an embodiment of the present disclosure may include a CPU 1220, Random Access Memory (RAM) 1230, a user interface 1240, a modem 1250, and a memory system 1210, which are electrically coupled to a system bus 1260. The computing system 1200 may be a mobile device.

The memory system 1210 may include a memory device 1212 and a memory controller 1211. The memory device 1212 may include a gate stacked body surrounding a channel structure, a first source layer overlapping the gate stacked body and having a protrusion, and a second source layer disposed between the gate stacked body and the first source layer and coming in contact with the channel layer of the channel structure.

According to the present disclosure, charges generated during the process of manufacturing a semiconductor memory device may be discharged through the protrusion of a first source layer, whereby an arcing phenomenon may be prevented. Accordingly, the present disclosure may improve the stability of the process of manufacturing the semiconductor memory device.

According to the present disclosure, the first source layer may be used as an ohmic contact layer, whereby the reliability of the operation of the semiconductor memory device may be ensured.

What is claimed is:

1. A semiconductor memory device, comprising:
   a gate stacked body;
   an insulating layer overlapping the gate stacked body and including a recessed portion;
   a first source layer including a horizontal portion between the gate stacked body and the insulating layer and a protrusion extending from the horizontal portion, wherein an upper surface of the protrusion protrudes toward the insulating layer and a lower surface of the protrusion protrudes toward the insulating layer, wherein at least a portion of the protrusion is disposed in the recessed portion of the insulating layer;
   a contact plug directly contacting the protrusion of the first source layer;
   a metal source line electrically coupled to the first source layer via the contact plug;
   a channel layer penetrating the gate stacked body and extending into the horizontal portion of the first source layer;
   a first memory pattern between the channel layer and the gate stacked body; and
   a second source layer disposed between the gate stacked body and the first source layer and being in contact with the channel layer;
   wherein the first source layer is disposed between the gate stacked body and the contact plug.

2. The semiconductor memory device according to claim 1, wherein:
   the first source layer includes a conductive material, and
   the first source layer has a lower resistivity than the second source layer.

3. The semiconductor memory device according to claim 1, wherein:
   the first source layer includes at least one of a tungsten silicide layer and a cobalt silicide layer, and
   the second source layer includes a doped semiconductor layer.

4. The semiconductor memory device according to claim 1, further comprising a second memory pattern disposed between the first source layer and the channel layer.

5. The semiconductor memory device according to claim 1, wherein the gate stacked body includes alternately stacked interlayer insulating layers and conductive patterns that surround the channel layer.

6. The semiconductor memory device according to claim 5, wherein the interlayer insulating layers extend so as to be overlapped by a portion of the protrusion of the first source layer.

7. The semiconductor memory device according to claim 1, wherein:
   the first source layer includes a first surface contacting the insulating layer and a second surface opposite the first surface,
   the second surface of the first source layer includes a groove defined by the protrusion of the first source layer, and
   the groove of the second surface of the first source layer protrudes towards the insulating layer.

8. The semiconductor memory device according to claim 1, further comprising a core insulating layer penetrating the gate stacked body, wherein:
   the channel layer surrounds a sidewall of the core insulating layer, and
   the channel layer extends between the core insulating layer and the first source layer so as to close an end portion of the core insulating layer facing the first source layer.

9. The semiconductor memory device according to claim 1, further comprising:
   an upper insulating layer covering the insulating layer and the protrusion;
   a contact plug penetrating the upper insulating layer and contacting the protrusion;
   a metal source line electrically coupled to the first source layer via the contact plug; and
   power lines spaced apart from the metal source line and overlapping the gate stacked body, wherein the insulating layer and the upper insulating layer are interposed between the power lines and the gate stacked body.

10. The semiconductor memory device according to claim 1, wherein a thickness of the horizontal portion of the first source layer is the same as a thickness of the protrusion of the first source layer.

11. The semiconductor memory device according to claim 1, wherein the lower surface of the protrusion is located closer to the insulating layer than an upper surface of the horizontal portion.

12. The semiconductor memory device according to claim 1, wherein the lower surface of the protrusion is located at a same level as an upper surface of the horizontal portion.

13. The semiconductor memory device according to claim 1, wherein:
   the second source layer includes a first portion being in contact with the protrusion and a second portion being in contact with the horizontal portion, and
   a thickness of the first portion of the second source layer is greater than a thickness of the second portion of the second source layer.

14. A semiconductor memory device, comprising:
   a first gate stacked body surrounding a first channel structure;
   a second gate stacked body adjacent to the first gate stacked body and surrounding a second channel structure;
   a vertical insulating structure between the first gate stacked body and the second gate stacked body;
   a first source layer including:
   a protrusion overlapping the vertical insulating structure and having a groove facing the vertical insulating structure;

a first horizontal portion extending from a first side of the protrusion to overlap the first channel structure and the first gate stacked body; and a second horizontal portion extending from a second side of the protrusion to overlap the second channel structure and the second gate stacked body; and a second source layer surrounding the first channel structure between the first source layer and the first gate stacked body and surrounding the second channel structure between the first source layer and the second gate stacked body, wherein an upper surface of the protrusion protrudes in a direction away from the vertical insulating structure, and a lower surface of the protrusion protrudes in the direction.

15. The semiconductor memory device according to claim 14, wherein:

the first source layer includes at least one of a tungsten silicide layer and a cobalt silicide layer, and the second source layer includes a doped semiconductor layer.

16. The semiconductor memory device according to claim 14, further comprising:

first memory patterns disposed respectively between the first gate stacked body and the first channel structure and between the second gate stacked body and the second channel structure; and second memory patterns disposed respectively between the first channel structure and the first source layer and between the second channel structure and the first source layer and spaced apart from the first memory patterns by the second source layer.

17. The semiconductor memory device according to claim 14, wherein the groove of the protrusion is defined by a curved shape.

18. The semiconductor memory device according to claim 14, wherein the vertical insulating structure extends into the second source layer.

19. A semiconductor memory device, comprising:

a first gate stacked body surrounding a first channel structure;

a second gate stacked body adjacent to the first gate stacked body and surrounding a second channel structure;

a vertical insulating structure between the first gate stacked body and the second gate stacked body;

a first source layer including:

a protrusion overlapping the vertical insulating structure and having a groove facing the vertical insulating structure;

a first horizontal portion extending from a first side of the protrusion to overlap the first channel structure and the first gate stacked body; and a second horizontal portion extending from a second side of the protrusion to overlap the second channel structure and the second gate stacked body; and a second source layer surrounding the first channel structure between the first source layer and the first gate stacked body and surrounding the second channel structure between the first source layer and the second gate stacked body, wherein an upper surface of the protrusion protrudes in a direction away from the vertical insulating structure, and a lower surface of the protrusion protrudes in the same direction, a contact plug directly contacting the protrusion of the first source layer; and a metal source line electrically coupled to the first source layer via the contact plug, wherein the first source layer includes a first surface and a second surface, wherein the first surface is adjacent to the second source layer and the vertical insulating structure, wherein the second surface faces an opposite direction to a direction which the first surface faces, the second surface including a first portion corresponding to the protrusion and a second portion corresponding to at least one of the first horizontal portion or the second horizontal portion, and wherein the first portion of the second surface protrudes compared to the second portion of the second surface.

20. The semiconductor memory device according to claim 14, wherein:

each of the first gate stacked body and the second gate stacked body includes alternately stacked interlayer insulating layers and conductive patterns, and each of the first channel structure and the second channel structure includes:

a core insulating layer penetrating the interlayer insulating layers and the conductive patterns; and a channel layer surrounding a sidewall of the core insulating layer and extending between the core insulating layer and the first source layer so as to close an end portion of the core insulating layer facing the first source layer.

* * * * *